(12) United States Patent
Kim et al.

(10) Patent No.: US 10,276,505 B2
(45) Date of Patent: Apr. 30, 2019

(54) INTEGRATED CIRCUIT DEVICE AND METHOD OF MANUFACTURING THE SAME

(71) Applicant: SAMSUNG ELECTRONICS CO., LTD., Suwon-si, Gyeonggi-Do (KR)

(72) Inventors: Young-Bae Kim, Seoul (KR); Sang-Hoon Ahn, Goyang-si (KR); Eui-Bok Lee, Seoul (KR); Su-Hyun Bark, Suwon-si (KR); Hyeok-Sang Oh, Suwon-si (KR); Woo-Jin Lee, Hwaseong-si (KR); Hoon-Seok Seo, Suwon-si (KR); Sung-Jin Kang, Seoul (KR)

(73) Assignee: SAMSUNG ELECTRONICS CO., LTD., Suwon-si, Gyeonggi-Do (KR)

(*) Notice: Subject to any disclaimer, the term of this patent is extended or adjusted under 35 U.S.C. 154(b) by 0 days.

(21) Appl. No.: 15/846,498

(22) Filed: Dec. 19, 2017

(65) Prior Publication Data

US 2018/0261544 A1  Sep. 13, 2018

Related U.S. Application Data

(63) Continuation-in-part of application No. 15/831,603, filed on Dec. 5, 2017.

(30) Foreign Application Priority Data

Mar. 8, 2017 (KR) .................. 10-2017-0029609
Mar. 8, 2017 (KR) .................. 10-2017-0029610

(51) Int. Cl.
*H01L 29/00* (2006.01)
*H01L 23/532* (2006.01)
(Continued)

(52) U.S. Cl.
CPC ........ *H01L 23/5329* (2013.01); *H01L 23/528* (2013.01); *H01L 23/5226* (2013.01);
(Continued)

(58) Field of Classification Search
CPC .......... H01L 23/5226; H01L 23/53223; H01L 23/53228; H01L 23/53266
(Continued)

(56) References Cited

U.S. PATENT DOCUMENTS 5,814,555 A * 9/1998 Bandyopadhyay ............... H01L 21/02164
257/E21.279
6,531,783 B1 * 3/2003 Kalnitsky ......... H01L 21/31111
257/734
(Continued)

FOREIGN PATENT DOCUMENTS

KR   1020080109281   12/2008

OTHER PUBLICATIONS

US OA dated Oct. 5, 2018 in Related U.S. Appl. No. 15/831,603.

*Primary Examiner* — Nitin Parekh
(74) *Attorney, Agent, or Firm* — F. Chau & Associates, LLC

(57) ABSTRACT

An integrated circuit (IC) device includes a lower wiring structure including a lower metal film. The lower wiring structure penetrates at least a portion of a first insulating film disposed over a substrate. The IC device further includes a capping layer covering a top surface of the lower metal film, a second insulating film covering the capping layer, an upper wiring structure penetrating the second insulating film and the capping layer, and electrically connected to the lower metal film, and an air gap disposed between the lower metal (Continued)

film and the second insulating film. The air gap has a width defined by a distance between the capping layer and the upper wiring structure.

20 Claims, 31 Drawing Sheets

(51) Int. Cl.
*H01L 23/522* (2006.01)
*H01L 23/528* (2006.01)

(52) U.S. Cl.
CPC .. *H01L 23/53223* (2013.01); *H01L 23/53238* (2013.01); *H01L 23/53266* (2013.01)

(58) Field of Classification Search
USPC .................................................. 257/522, 751
See application file for complete search history.

(56) References Cited

U.S. PATENT DOCUMENTS

| 6,888,247 | B2* | 5/2005 | Lee ................... H01L 21/76802 257/276 |
| 7,268,087 | B2 | 9/2007 | Aoki |
| 7,361,991 | B2* | 4/2008 | Saenger ............ H01L 21/76807 257/552 |
| 7,846,841 | B2 | 12/2010 | Ishizaka et al. |
| 7,910,476 | B2 | 3/2011 | Fang et al. |
| 8,017,519 | B2 | 9/2011 | Ishikawa |
| 8,120,179 | B2* | 2/2012 | Chanda ............... H01L 21/7682 257/751 |
| 8,143,162 | B2 | 3/2012 | Yu et al. |
| 8,384,217 | B2 | 2/2013 | Streck et al. |
| 8,749,058 | B2 | 6/2014 | Usami et al. |
| 9,041,216 | B2 | 5/2015 | Sung et al. |
| 9,269,612 | B2 | 2/2016 | Chen et al. |
| 9,305,836 | B1* | 4/2016 | Gates ................ H01L 21/28556 |
| 9,425,144 | B2 | 8/2016 | Bonilla et al. |
| 9,437,484 | B2 | 9/2016 | Jangjian et al. |
| 2005/0087871 | A1 | 4/2005 | Abe |
| 2006/0073695 | A1* | 4/2006 | Filippi ............. H01L 21/76807 438/619 |
| 2008/0174017 | A1* | 7/2008 | Yang ................... H01L 21/7682 257/751 |
| 2009/0072409 | A1* | 3/2009 | Nitta ................. H01L 21/76808 257/774 |
| 2010/0025852 | A1 | 2/2010 | Ueki et al. |
| 2014/0273438 | A1 | 9/2014 | Ye et al. |
| 2014/0299989 | A1* | 10/2014 | Lim ....................... H01L 23/48 257/751 |
| 2015/0014759 | A1* | 1/2015 | Lee ..................... H01L 23/5329 257/306 |
| 2015/0137375 | A1* | 5/2015 | Chen ................ H01L 23/53238 257/751 |
| 2015/0179499 | A1* | 6/2015 | Yang ................ H01L 21/76807 257/751 |
| 2016/0071801 | A1 | 3/2016 | Lin et al. |
| 2016/0133512 | A1 | 5/2016 | Lee et al. |

\* cited by examiner

INTEGRATED CIRCUIT DEVICE AND METHOD OF MANUFACTURING THE SAME

CROSS-REFERENCE TO RELATED APPLICATIONS

This application is a Continuation-in-Part Application of U.S. application Ser. No. 15/831,603, filed on Dec. 5, 2017, which claims priority under 35 U.S.C. § 119 to Korean Patent Application No. 10-2017-0029609, filed on Mar. 8, 2017, and further claims priority under 35 U.S.C. § 119 to Korean Patent Application No. 10-2017-0029610, filed on Mar. 8, 2017, the disclosures of which are incorporated by reference herein in their entireties.

TECHNICAL FIELD

Exemplary embodiments of the inventive concept relate to an integrated circuit device and a method of manufacturing the same, and more particularly, to an integrated circuit device including a multilayered wiring structure, and a method of manufacturing the integrated circuit device.

DISCUSSION OF THE RELATED ART

As technology advances, integrated circuit devices are quickly becoming more downscaled. Accordingly, line widths and pitches of metal wiring layers included in the integrated circuit devices are being reduced. In this regard, suppressing resistance increases and current leakages of the metal wiring layers, and suppressing electromigration of metals, may reduce physical damage to a multilayered wiring structure including the metal wiring layers from occurring, thereby increasing the reliability and lifespan of the integrated circuit devices.

SUMMARY

Exemplary embodiments of the inventive concept provide an integrated circuit device having an increased lifespan and increased reliability by suppressing a resistance increase and a current leakage of metal wiring layers, suppressing electromigration of a metal, and preventing physical damage to a multilayered wiring structure from occurring.

According to an exemplary embodiment of the inventive concept, an integrated circuit device includes a lower wiring structure including a lower metal film. The lower wiring structure penetrates at least a portion of a first insulating film disposed over a substrate. The integrated circuit device further includes a capping layer covering a top surface of the lower metal film, a second insulating film covering the capping layer, an upper wiring structure penetrating the second insulating film and the capping layer, and electrically connected to the lower metal film, and an air gap disposed between the lower metal film and the second insulating film. The air gap has a width defined by a distance between the capping layer and the upper wiring structure.

According to an exemplary embodiment of the inventive concept, an integrated circuit device includes a lower wiring structure including a lower metal film that extends in a first direction, and that penetrates at least a portion of a first insulating film disposed over a substrate. The integrated circuit device further includes a capping layer covering a top surface of the lower metal film and a top surface of the first insulating film, a second insulating film covering the capping layer, a contact plug penetrating the second insulating film and the capping layer, and electrically connected to the lower metal film, and an air gap disposed between the lower metal film and the second insulating film. The air gap is disposed at a corner region defined by the top surface of the lower metal film and a side wall of the contact plug.

According to an exemplary embodiment of the inventive concept, a method of manufacturing an integrated circuit device includes forming a first hole by etching a first insulating film over a substrate, forming a lower wiring structure including a lower metal film inside the first hole, forming a capping layer covering the lower wiring structure and the first insulating film, forming a second insulating film covering the capping layer, forming a second hole penetrating the second insulating film and the capping layer in a first direction, and forming, in the capping layer, a cutout region extending from the second hole. Forming the cutout region includes removing a portion of the capping layer through the second hole in a second direction substantially perpendicular to the first direction. The method further includes forming an upper wiring structure in the second hole. An air gap is formed in the cutout region between the upper wiring structure and a portion of the capping layer.

BRIEF DESCRIPTION OF THE DRAWINGS

The above and other features of the present inventive concept will become more apparent by describing in detail exemplary embodiments thereof with reference to the accompanying drawings, in which.

DETAILED DESCRIPTION OF THE EXEMPLARY EMBODIMENTS

Figure 1A:
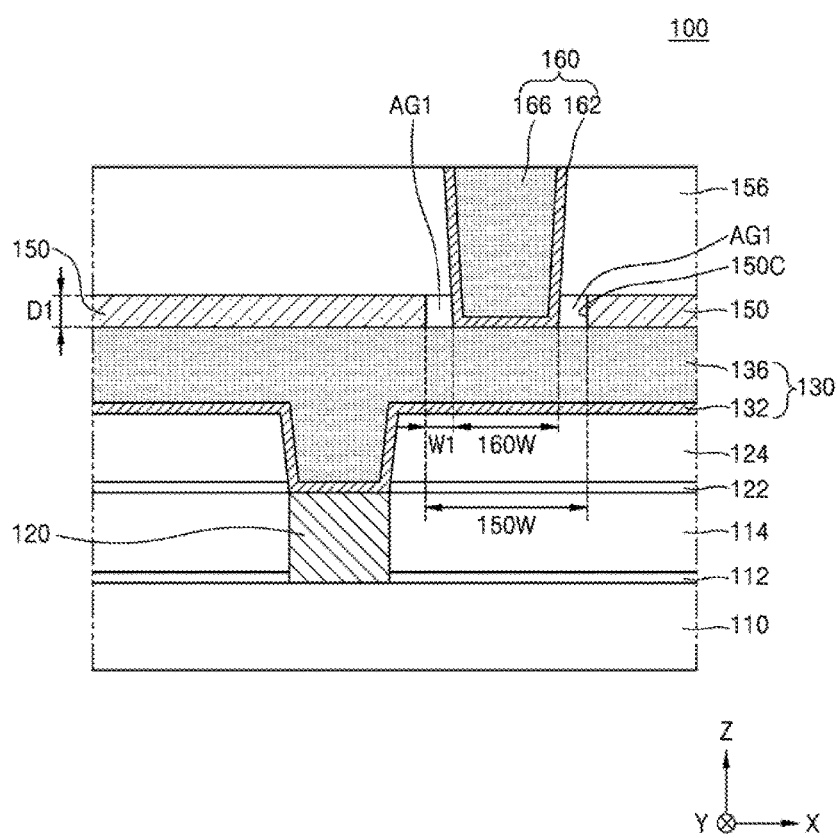
FIG. 1A is a cross-sectional view of components of an integrated circuit device, according to an exemplary embodiment of the inventive concept.

Exemplary embodiments of the inventive concept will be described more fully hereinafter with reference to the accompanying drawings. Like reference numerals may refer to like elements throughout the accompanying drawings.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

It will be understood that when a component, such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" or "surrounding" another component, it can be the only component covering or surrounding the other component, or one or more intervening components may also be covering or surrounding the other component.

It will be further understood that when a component is described as surrounding or covering another component, the component may entirely or partially surround or cover the other component, in accordance with the illustration of the components in the drawings.

It will be further understood that the terms "first," "second," "third," etc. are used herein to distinguish one element from another, and the elements are not limited by these terms. Thus, a "first" element in an exemplary embodiment may be described as a "second" element in another exemplary embodiment.

Herein, when two or more elements or values are described as being substantially the same as or about equal to each other, it is to be understood that the elements or values are identical to each other, indistinguishable from each other, or distinguishable from each other but functionally the same as each other as would be understood by a person having ordinary skill in the art.

It will be further understood that when two components or directions are described as extending substantially parallel or perpendicular to each other, the two components or directions extend exactly parallel or perpendicular to each other, or extend approximately parallel or perpendicular to each other as would be understood by a person having ordinary skill in the art.

FIG. 1A is a cross-sectional view of components of an integrated circuit device 100, according to an exemplary embodiment of the inventive concept.

Referring to FIG. 1A, the integrated circuit device 100 includes a lower wiring structure 130 that penetrates at least a portion of a first insulating film 124 formed over a substrate 110. The lower wiring structure 130 may include a conductive line portion that extends along one direction, for example, an X-direction.

The substrate 110 may include a semiconductor such as, for example, silicon (Si) or germanium (Ge), or may include a compound semiconductor such as, for example, SiGe, silicon carbide (SiC), gallium arsenide (GaAs), indium arsenide (InAs), or indium phosphide (InP). The substrate 110 may include a conductive region, and may include circuit elements such as, for example, a gate structure, an impurity region, and a contact plug.

A first etch-stop layer 112, a lower insulating film 114, and a lower conductive film 120 that penetrates the lower insulating film 114 and the first etch-stop layer 112, may be disposed on the substrate 110. In an exemplary embodiment, the first etch-stop layer 112 is formed of a material having an etch selectivity different from the lower insulating film 114.

For example, the first etch-sop layer 112 may be formed of a silicon nitride (SiN) layer, a carbon-doped SiN layer, a carbon-doped silicon oxynitride (SiON) layer, a metal nitride layer, or a combination thereof. According to an exemplary embodiment, the lower insulating film 114 may be formed of a silicon oxide-based material. For example, the lower insulating film 114 may be formed of plasma-enhanced oxide (PEOX), tetraethyl orthosilicate (TEOS), boro TEOS (BTEOS), phosphorous TEOS (PTEOS), boro phospho TEOS (BPTEOS), boro silicate glass (BSO), phospho silicate glass (PSG), or boro phospho silicate glass (BPSG). According to an exemplary embodiment, the lower insulating film 114 is a low dielectric film having a low dielectric constant K from about 2.2 to about 3.0, such as, for example, a SiOC film or a silicon SiCOH film. In an exemplary embodiment, the lower conductive film 120 includes a metal film and a conductive barrier film that surrounds the metal film. The metal film may be formed of, for example, copper (Cu), tungsten (W), aluminum (Al), cobalt (Co), ruthenium (Ru), or a combination thereof. The conductive barrier film may be formed of, for example, tantalum (Ta), TaN, titanium (Ti), TiN, or a combination thereof. In an exemplary embodiment, the lower conductive film 120 is connected to the conductive region of the substrate 110. For example, in an exemplary embodiment, the lower conductive film 120 is connected to a source/drain region or a gate electrode of a transistor disposed in the substrate 110.

In an exemplary embodiment, a second etch-stop layer 122 (also referred to as a second etch-stop film 122) and the first insulating film 124 are sequentially disposed over the lower insulating film 114. The lower wiring structure 130 penetrates the first insulating film 124 and the second etch-stop layer 122, and extends down in a direction toward the lower conductive film 120. In an exemplary embodiment, the lower wiring structure 130 contacts (e.g., directly contacts) the lower conductive film 120. Materials that form the second etch-stop film 122 and the first insulating film 124 are the same as or similar to those of the first etch-stop layer 112 and the lower insulating film 114 described above.

In an exemplary embodiment, the lower wiring structure 130 includes a lower conductive barrier film 132 and a lower metal film 136. The lower conductive barrier film 132 surrounds a bottom surface and a side wall of the lower metal film 136. The lower conductive barrier film 132 may include, for example, Ta, TaN, Ti, TiN, or a combination thereof. The lower metal film 136 may include, for example, Cu, W, Co, Ru, manganese (Mn), Ti, Ta, or a combination thereof.

A top surface of the lower metal film 136 is covered by a capping layer 150. The capping layer 150 may include, for example, an insulating capping layer, a conductive capping layer, or a combination thereof. According to an exemplary embodiment, the capping layer 150 may include, for example, silicon carbide (SiC), silicon nitride (SiN), nitrogen-doped silicon carbide (SiC:N), silicon oxycarbide (SiOC), aluminum nitride (AlN), aluminum oxynitride (AlON), aluminum oxide (AlO), aluminum oxycarbide (AlOC), a metal, an alloy, or a combination thereof. The term "alloy" used herein means a material formed of a combination of different types of metals or a material formed of a combination of a metal and an element other than a metal. For example, a metal included in the capping layer 150 may include Co, Ni, Ta, Ru, W, Mn, or a combination thereof. In an exemplary embodiment, the metal included in the capping layer 150 may include at least one of Co, Ni, Ta, Ru, W, or Mn, and a semiconductor element included in the capping layer 150 may include Si or Ge. According to an exemplary embodiment, the capping layer 150 may include a nitrogen-containing film therein or on a surface thereof. For example, the capping layer 150 may include a nitride of a metal including Co, Ni, Ta, Ru, W, and Mn, or a combination thereof.

The capping layer 150 is covered by a second insulating film 156. In an exemplary embodiment, an upper wiring structure 160 penetrates the second insulating film 156 and the capping layer 150, and contacts (e.g., directly contacts) the lower metal film 136. As a result, the upper wiring structure 160 is electrically connected to the lower metal film 136. In exemplary embodiments, the upper wiring structure 160 does not directly contact the lower metal film 136, and is electrically connected to the lower metal film 136 via at least one intervening element. In an exemplary embodiment, the upper wiring structure 160 includes an upper conductive barrier film 162 and an upper metal film 166. Details regarding materials of the upper conductive barrier film 162 and the upper metal film 166 are the same as or similar to those of the lower conductive barrier film 132 and the lower metal film 136 described above. According to an exemplary embodiment, the upper wiring structure 160 forms a contact plug. Thus, it is to be understood that in the figures, the upper wiring structure 160 may also be referred to as a contact plug 160. In an exemplary embodiment, the lower wiring structure 130 includes a conductive line portion connected to the upper wiring structure 160, and a contact plug portion connected to the lower conductive film 120 by protruding towards the substrate 110 from the conductive line portion.

An air gap AG1 is disposed adjacent (e.g., directly adjacent) to the upper wiring structure 160, between the lower metal film 136 and the second insulating film 156. In an exemplary embodiment, a width W1 of the air gap AG1 is defined by the capping layer 150 and the upper wiring structure 160. For example, the width W1 of the air gap AG1 corresponds to a horizontal distance (e.g., in the X direction) from a side wall of the upper wiring structure 160 exposed inside the air gap AG1 to a side wall of the capping layer 150 exposed inside the air gap AG1, as shown in FIG. 1A. For example, the width W1 of the air gap AG1 is about equal to the horizontal distance between a side wall of the upper wiring structure 160 (e.g., a side wall of the upper conductive barrier film 162 of the upper wiring structure 160) that forms one boundary of the air gap AG1, and a side wall of the capping layer 150 that forms an opposite boundary of the air gap AG1. Herein, when a width is described as corresponding to a horizontal distance or being defined by a horizontal distance, it is to be understood that the width is about equal to the horizontal distance. The width W1 of the air gap AG1 may be from about 2 nm to about 10 nm, but is not limited thereto. In an exemplary embodiment, the lower metal film 136 defines a lower limit of the air gap AG1, and the second insulating film 156 defines an upper limit of the air gap AG1. Thus, in an exemplary embodiment, a height of the air gap AG1 corresponds to a thickness D1 of the capping layer 150, and is defined by the lower metal film 136 and the second insulating film 156. For example, the height of the air gap AG1 is about equal to the vertical distance (e.g., in the Z-direction) between a surface of the lower metal film 136 that forms one boundary of the air gap AG1, and a surface of the second insulating film 156 that forms an opposite boundary of the air gap AG1.

In an exemplary embodiment, the air gap AG1 is disposed at a corner region defined by the top surface of the lower metal film 136 and the side wall of the upper wiring structure 160. For example, the air gap AG1 is disposed in a region at which the top surface of the lower metal film 136 meets the side wall of the upper wiring structure 160, as shown in FIG. 1A. According to an exemplary embodiment, the air gap AG1 extends to surround the upper wiring structure 160 along a circumferential direction of the upper wiring structure 160 at a location perpendicularly overlapping the lower metal film 136. Herein, when one object is said to be "perpendicularly overlapping" another object, the two objects overlap each other along the Z-direction. For example, in an exemplary embodiment, when viewed from a top view, the air gap AG1 surrounds the upper wiring structure 160 such that the capping layer 150 does not contact the wiring structure (e.g., the air gap AG1 is disposed between the upper wiring structure 160 and the capping layer 150) (see FIGS. 1B and 1C).

In an exemplary embodiment, the capping layer 150 includes a cutout region 150C having a width 150W wider than a width 160W of a bottom surface of the upper wiring structure 160, and a volume of the air gap AG1 is about equal to a volume of the cutout region 150C excluding a portion occupied by the upper wiring structure 160.

According to an exemplary embodiment, at least one of the first insulating film 124 and the second insulating film 156 are formed of a silicon oxide-based material such as, for example, PEOX, TEOS, BTEOS, PTEOS, BPTEOS, BSG, PSG, or BPSG. According to an exemplary embodiment, at least one of the first insulating film 124 and the second insulating film 156 include a low dielectric film having a low dielectric constant from about 2.7 to about 3.0 such as, for example, a SiOC film or a SiCOH film. According to an exemplary embodiment, at least one of the first insulating film 124 and the second insulating film 156 include an ultra-low-K (ULK) film having an ultra-low dielectric constant K from about 2.2 to about 2.4 such as, for example, a SiOC film or a SiCOH film. According to an exemplary embodiment, at least one of the first insulating film 124 and the second insulating film 156 include an inorganic polymer such as, for example, fluorine-doped silicon oxide ($F$—$SiO_2$), porous silicon oxide, a spin-on organic polymer, hydrogen silsesquioxane (HSSQ), or methyl silsesquioxane (MSSQ).

Figure 1B:
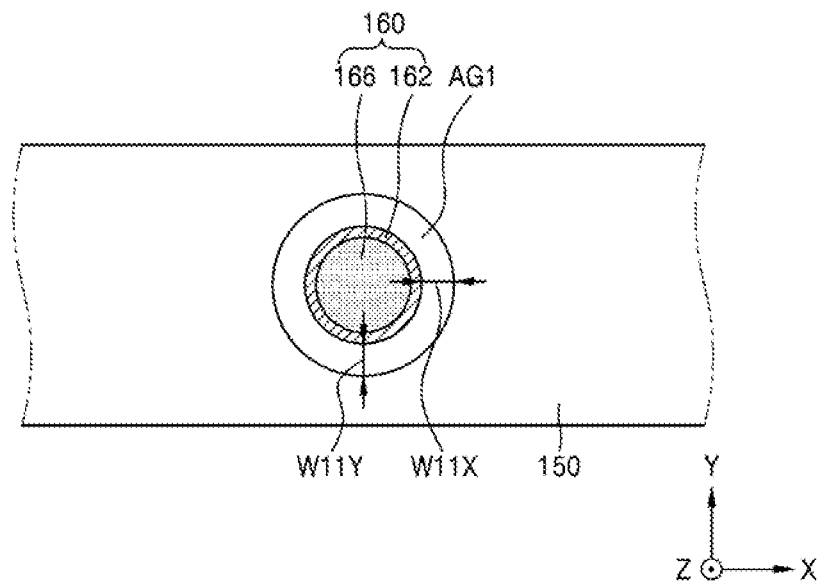
FIG. 1B is a layout diagram of a planar structure of components of the integrated circuit device of FIG. 1A, according to an exemplary embodiment of the inventive concept.

FIG. 1B is a layout diagram of a planar structure of components of the integrated circuit device 100 of FIG. 1A, according to an exemplary embodiment of the inventive concept. Referring to FIGS. 1A and 1B, in an exemplary embodiment, the air gap AG1 has an annular shape surrounding the upper wiring structure 160 over the top surface of the lower metal film 136. As shown in FIG. 1B, in an exemplary embodiment, the air gap AG1 entirely surrounds the upper wiring structure 160 such that the upper wiring structure 160 does not contact the capping layer 150. In the exemplary embodiment shown in FIG. 1B, a width of the air gap AG1 is constant along the circumferential direction of the upper wiring structure 160. For example, a width W11X of the air gap AG1 along a length direction (X-direction) of the lower metal film 136 and a width W11Y of the air gap AG1 along a width direction (Y-direction) of the lower metal film 136 may be about the same. In the exemplary embodiment shown in FIG. 1B, the capping layer 150 does not contact the upper wiring structure 160 due to the presence of the air gap AG1.

Figure 1C:
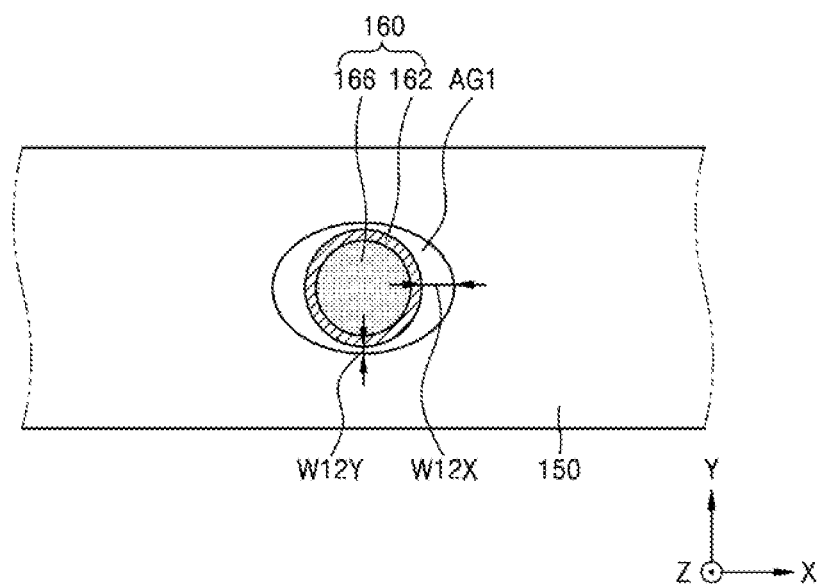
FIGS. 1C through 1E are layout diagrams of planar structures of components of the integrated circuit device of FIG. 1A, according to exemplary embodiments of the inventive concept.
Figure 1D:
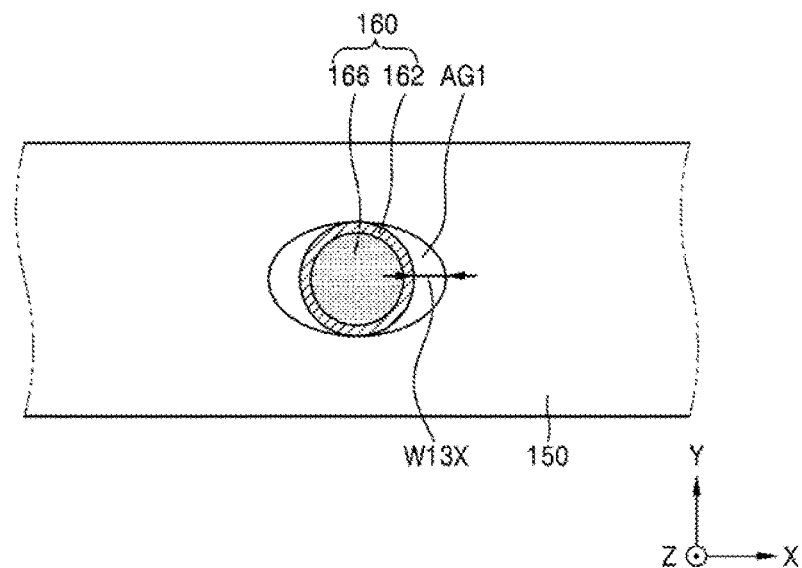
Figure 1E:
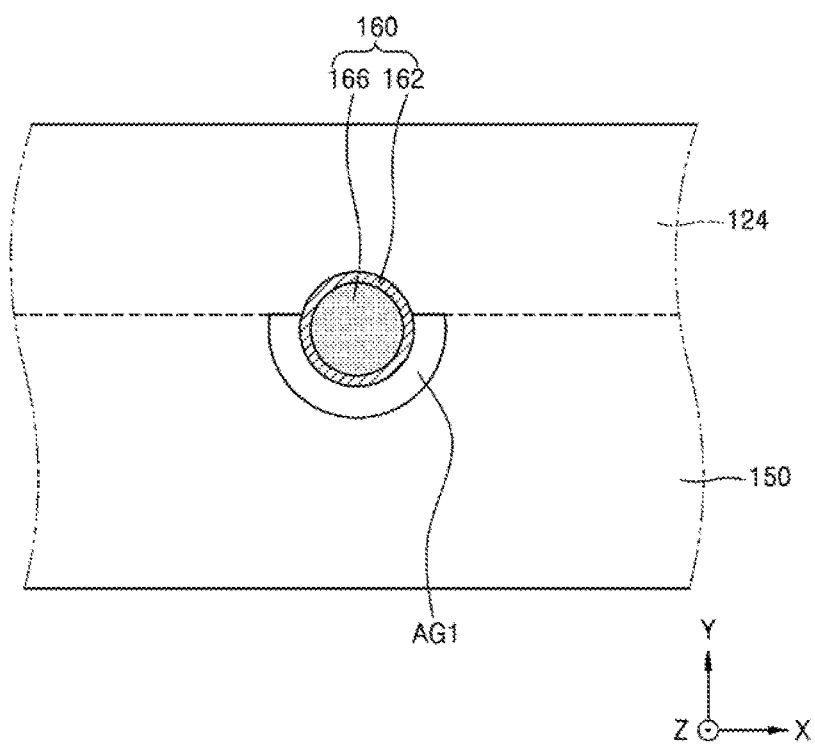

FIGS. 1C through 1E are layout diagrams of planar structures of components of the integrated circuit device 100 of FIG. 1A, according to exemplary embodiments of the inventive concept.

Referring to FIGS. 1A and 1C, in an exemplary embodiment, the air gap AG1 has an annular shape surrounding the upper wiring structure 160 over the top surface of the lower metal film 136. As shown in FIG. 1C, in an exemplary embodiment, the air gap AG1 entirely surrounds the upper wiring structure 160 such that the upper wiring structure 160 does not contact the capping layer 150. In the exemplary embodiment shown in FIG. 1C, the width of the air gap AG1 varies along the circumferential direction of the upper wiring structure 160. For example, a width W12X of the air gap AG1 along the length direction (X-direction) of the lower metal film 136 is larger than a width W12Y of the air gap AG1 along the width direction (Y-direction) of the lower metal film 136. In the exemplary embodiment shown in FIG. 1C, the capping layer 150 does not contact the upper wiring structure 160 due to the presence of the air gap AG1.

Referring to FIGS. 1A and 1D, in an exemplary embodiment, instead of entirely surrounding the upper wiring structure 160, the air gap AG1 partially surrounds the upper wiring structure 160 over the top surface of the lower metal film 136. In the exemplary embodiment of FIG. 1D, the air gap AG1 is disposed between the capping layer 150 and the upper wiring structure 160 in the length direction (X-direction) of the lower metal film 136, and the capping layer 150 and the upper wiring structure 160 partially contact each other along the width direction (Y-direction) of the lower metal film 136, as shown in FIG. 1D. For example, as shown in FIG. 1D, in an exemplary embodiment, a width W13X of the air gap AG1 exists along the length direction (X-direction) of the lower metal film 136, and a width of the air gap AG1 does not exist along the width direction (Y-direction) of the lower metal film 136, since the capping layer 150 and the upper wiring structure 160 partially contact each other along the width direction (Y-direction) of the lower metal film 136.

Referring to FIGS. 1A and 1E, in an exemplary embodiment, the upper wiring structure 160 is formed at a location that is misaligned from a center of the width direction (Y-direction) of the lower metal film 136 along the width direction (Y-direction), such that a portion of the upper wiring structure 160 covers a top surface of the first insulating film 124 around the lower metal film 136. In FIG. 1E, a location of the first insulating film 124 covered by the capping layer 150 is indicated by a dashed line. The upper wiring structure 160 includes a portion perpendicularly overlapping the lower metal film 136 and a portion perpendicularly overlapping the first insulating film 124. The air gap AG1 partially surrounds a circumference of the upper wiring structure 160 over the top surface of the lower metal film 136. The air gap AG1 is not formed around the portion of the upper wiring structure 160 perpendicularly overlapping the first insulating film 124, and extends along the circumferential direction of the upper wiring structure 160 so as to surround only the portion of the upper wiring structure 160 perpendicularly overlapping the lower metal film 136.

Although examples of planar forms of the air gap AG1 have been described with reference to FIGS. 1B through 1E, exemplary embodiments of the inventive concept are not limited thereto.

Figure 2:
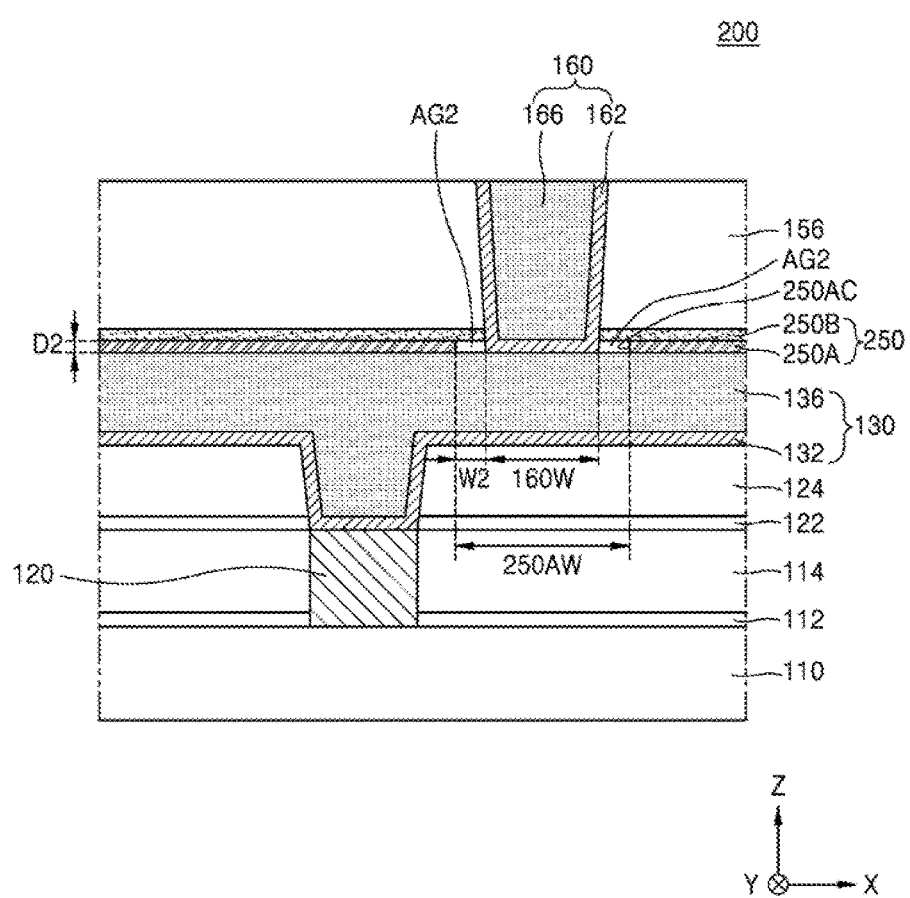
FIGS. 2 through 7 are cross-sectional views of integrated circuit devices, according to exemplary embodiments of the inventive concept.

FIG. 2 is a cross-sectional view of an integrated circuit device 200, according to an exemplary embodiment of the inventive concept.

Referring to FIG. 2, the integrated circuit device 200 has substantially the same structure as the integrated circuit device 100 of FIG. 1A. However, in the integrated circuit device 200 of FIG. 2, the top surface of the lower metal film 136 is covered by a capping layer 250 that includes a multi-layered insulating layer. For example, in an exemplary embodiment, the capping layer 250 includes a first insulating capping layer 250A that includes a metal, and a second insulating capping layer 250B that does not include a metal (e.g., that does not include the metal included in the first insulating capping layer 250A or another metal). The first insulating capping layer 250A may be formed of, for example, AlN, AlON, AlO, or AlOC. The second insulating capping layer 250B may be formed of, for example, SiC, SiN, SiC:N, or SiOC.

The capping layer 250 is covered by the second insulating film 156. The upper wiring structure 160 extends such that it penetrates the second insulating film 156 and the capping layer 250, and is electrically connected to the lower metal film 136.

An air gap AG2 that surrounds the upper wiring structure 160 is disposed between the lower metal film 136 and the second insulating film 156. In an exemplary embodiment, a width W2 of the air gap AG2 is defined by the upper wiring structure 160 and the first insulating capping layer 250A of the capping layer 250. For example, the width W2 of the air gap AG2 corresponds to a horizontal distance (e.g., in the X-direction) from the side wall of the upper wiring structure 160 exposed inside the air gap AG2 to a side wall of the first insulating capping layer 250A exposed inside the air gap AG2, as shown in FIG. 2. For example, the width W2 of the air gap AG2 is about equal to the horizontal distance between a side wall of the upper wiring structure 160 (e.g., a side wall of the upper conductive barrier film 162 of the upper wiring structure 160) that forms one boundary of the air gap AG2, and a side wall of the first insulating capping layer 250A that forms an opposite boundary of the air gap AG2. The width W2 of the air gap AG2 may be from about 2 nm to about 10 nm. In an exemplary embodiment, a height of the air gap AG2 is defined by the lower metal film 136 and the second insulating capping layer 250B. Thus, in an exemplary embodiment, the height of the air gap AG2 corresponds to a thickness D2 of the first insulating capping layer 250A. For example, the height of the air gap AG2 is about equal to the vertical distance (e.g., in the Z-direction) between a surface of the lower metal film 136 that forms one boundary of the air gap AG2, and a surface of the second insulating capping layer 250B that forms an opposite boundary of the air gap AG2.

In an exemplary embodiment, the air gap AG2 is disposed at a corner region defined by the top surface of the lower metal film 136 and the side wall of the upper wiring structure 160. For example, the air gap AG2 is disposed in a region at which the top surface of the lower metal film 136 meets the side wall of the upper wiring structure 160, as shown in FIG. 2. The air gap AG2 may have, for example, any one of the planar forms of the air gap AG1 shown in FIGS. 1B through 1E. However, the air gap AG2 is not limited thereto. In an exemplary embodiment, the first insulating capping layer 250A includes a cutout region 250AC having a width 250AW larger than the width 160W of the bottom surface of the upper wiring structure 160, and a volume of the air gap AG2 is about equal to a volume of the cutout region 250AC excluding a portion occupied by the upper wiring structure 160.

Figure 3:
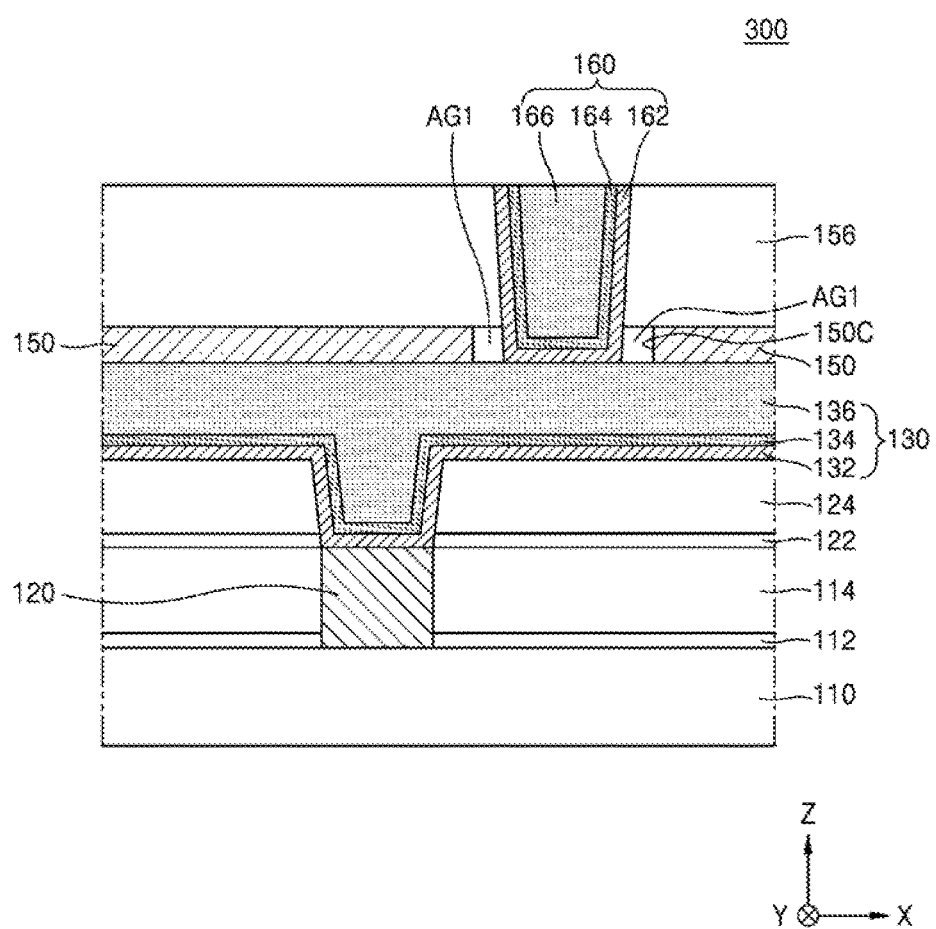

FIG. 3 is a cross-sectional view of an integrated circuit device 300, according to an exemplary embodiment of the inventive concept.

Referring to FIG. 3, the integrated circuit device 300 has substantially the same structure as the integrated circuit device 100 of FIG. 1A. However, the lower wiring structure 130 of the integrated circuit device 300 of FIG. 3 further includes a lower metal liner 134 disposed between the lower conductive barrier film 132 and the lower metal film 136, and the upper wiring structure 160 further includes an upper metal liner 164 disposed between the upper conductive barrier film 162 and the upper metal film 166.

The lower and upper metal liners 134 and 164 include a metal different from that included in each of the lower and upper metal films 136 and 166. For example, the lower and upper metal films 136 and 166 may include a first metal such as Cu, W, Co, Ru, Mn, Ti, or Ta, and the lower and upper metal liners 134 and 164 may include a second metal different from the first metal such as Co, Ni, Ta, Ru, W, or Mn, or may include an alloy of the second metal. According to an exemplary embodiment, the lower and upper metal liners 134 and 164 may each be a Co liner or a Ta liner.

Figure 4:
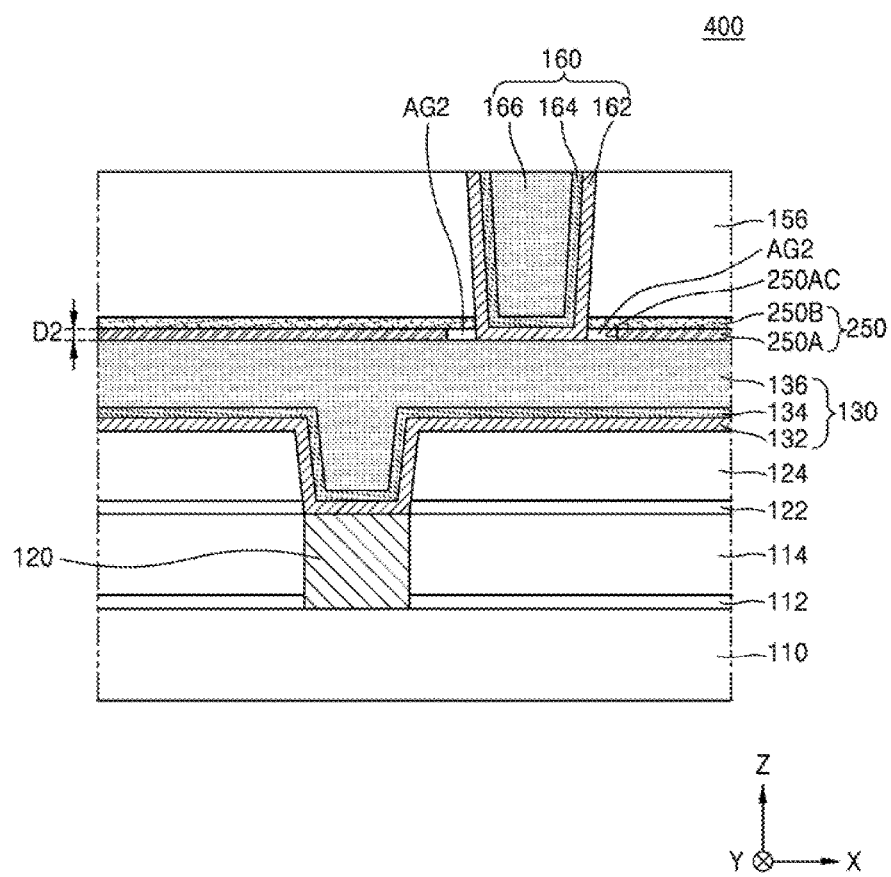

FIG. 4 is a cross-sectional view of an integrated circuit device 400, according to an exemplary embodiment of the inventive concept.

Referring to FIG. 4, the integrated circuit device 400 has substantially the same structure as the integrated circuit device 200 of FIG. 2. However, in the integrated circuit device 400 of FIG. 4, the lower wiring structure 130 further includes the lower metal liner 134 disposed between the lower conductive barrier film 132 and the lower metal film 136, and the upper wiring structure 160 further includes the upper metal liner 164 disposed between the upper conductive barrier film 162 and the upper metal film 166.

Figure 5:
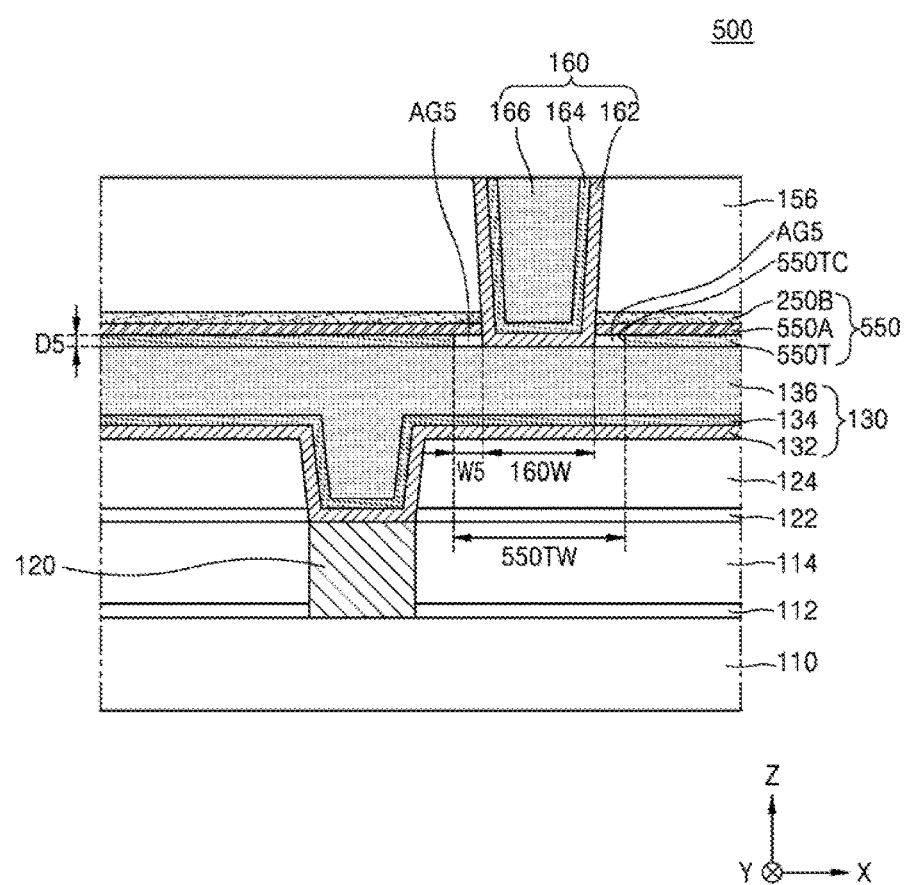

FIG. 5 is a cross-sectional view of an integrated circuit device 500, according to an exemplary embodiment of the inventive concept.

Referring to FIG. 5, the integrated circuit device 500 has substantially the same structure as the integrated circuit device 400 of FIG. 4. However, in the integrated circuit device 500 of FIG. 5, the top surface of the lower metal film 136 is covered by a capping layer 550 that includes a combination of a conductive layer and an insulating layer. For example, the capping layer 550 includes a conductive capping layer 550T, a first insulating capping layer 550A that includes a metal, and the second insulating capping layer 250B that does not include a metal (e.g., that does not include the metal included in the first insulating capping layer 550A or another metal).

In an exemplary embodiment, the conductive capping layer 550T includes the same metal as that of the lower metal liner 134. For example, the conductive capping layer 550T may include a metal or alloy including Co, Ni, Ta, Ru, W, Mn, or a combination thereof. The first insulating capping layer 550A may be formed of, for example, AlN, AlON, AlO, or AlOC. The capping layer 550 is covered by the second insulating film 156. The upper wiring structure 160 penetrates the second insulating film 156 and the capping layer 550, and extends down to and contacts the lower metal film 136.

An air gap AG5 is disposed between the lower metal film 136 and the second insulating film 156. For example, the air gap AG5 is disposed between the lower metal film 136 and the first insulating capping layer 550A. In an exemplary embodiment, a width W5 of the air gap AG5 is defined by the conductive capping layer 550T and the upper wiring structure 160. For example, the width W5 of the air gap AG5 corresponds to a horizontal distance (e.g., in the X-direction) from a side wall of the conductive capping layer 550T exposed inside the air gap AG5 to a side wall of the upper wiring structure 160 exposed inside the air gap AG5, as shown in FIG. 5. For example, the width W5 of the air gap AG5 is about equal to the horizontal distance between a side wall of the upper wiring structure 160 (e.g., a side wall of the upper conductive barrier film 162 of the upper wiring structure 160) that forms one boundary of the air gap AG5, and a side wall of the conductive capping layer 550T that forms an opposite boundary of the air gap AG5. The width W5 of the air gap AG5 may be from about 2 nm to about 10 nm. In an exemplary embodiment, a height of the air gap AG5 is defined by the lower metal film 136 and the first insulating capping layer 550A, and corresponds to a thickness D5 of the conductive capping layer 550T. For example, the height of the air gap AG5 is about equal to the vertical distance (e.g., in the Z-direction) between a surface of the lower metal film 136 that forms one boundary of the air gap AG5, and a surface of the first insulating capping layer 550A that forms an opposite boundary of the air gap AG5.

In an exemplary embodiment, the air gap AG5 is disposed at a corner region defined by the top surface of the lower metal film 136 and the side wall of the upper wiring structure 160. For example, the air gap AG5 is disposed in a region at which the top surface of the lower metal film 136 meets the side wall of the upper wiring structure 160, as shown in FIG. 5. The air gap AG5 may have, for example, any one of the planar forms of the air gap AG1 shown in FIGS. 1B through 1E. However, the air gap AG5 is not limited thereto. In an exemplary embodiment, the first and second insulating capping layers 550A and 250B of the capping layer 550 contact the side wall of the upper wiring structure 160 (e.g., contact the side wall of the upper conductive barrier film 162 of the upper wiring structure 160). In an exemplary embodiment, the conductive capping layer 550T includes a cutout region 550TC having a width 550TW that is wider than the width 160W of the bottom surface of the upper wiring structure 160, and a volume of the air gap AG5 is about equal to that of the cutout region 550TC excluding a portion occupied by the upper wiring structure 160.

Figure 6:
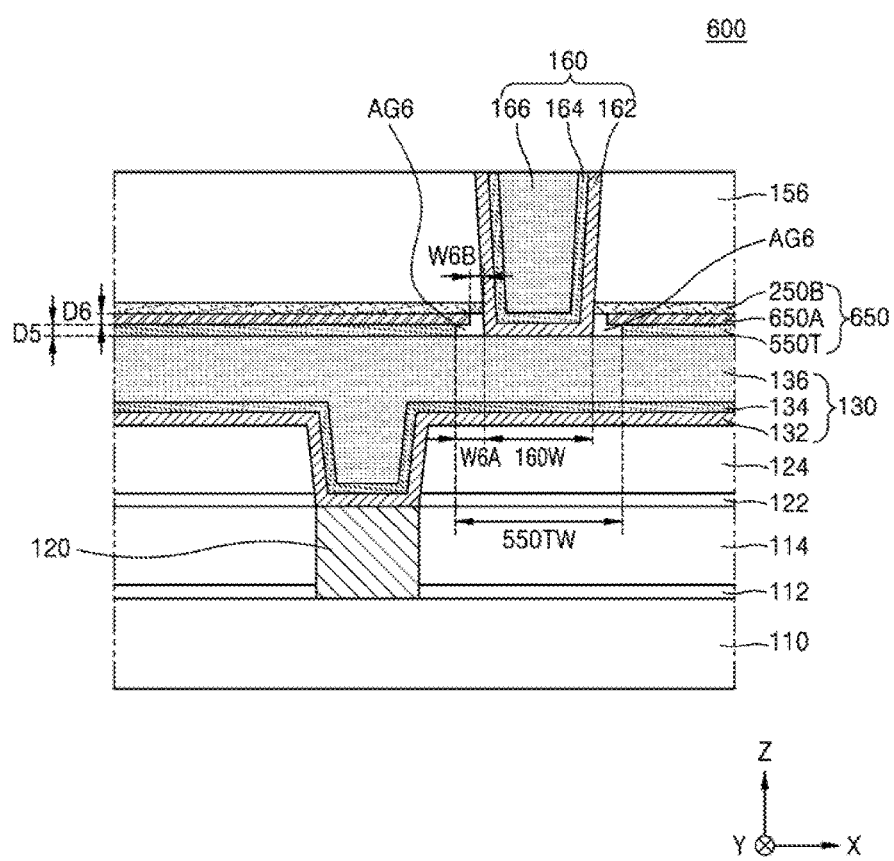

FIG. 6 is a cross-sectional view of an integrated circuit device 600, according to an exemplary embodiment of the inventive concept.

Referring to FIG. 6, the integrated circuit device 600 has substantially the same structure as the integrated circuit device 500 of FIG. 5. In the integrated circuit device 600 of FIG. 6, the top surface of the lower metal film 136 is covered by a capping layer 650 that includes a combination of a conductive layer and an insulating layer. For example, the capping layer 650 includes the conductive capping layer 550T, a first insulating capping layer 650A that includes a metal, and the second insulating capping layer 250B that does not include a metal. As shown in FIG. 6, first insulating capping layer 650A is spaced apart from the side wall of the upper wiring structure 160.

An air gap AG6 is disposed between the lower metal film 136 and the second insulating film 156. In an exemplary embodiment, a side wall of the conductive capping layer 550T that faces the upper wiring structure 160, and a side wall of the first insulating capping layer 650A that faces the upper wiring structure 160, are each spaced apart from the upper wiring structure 160, with the air gap AG6 interposed therebetween. A lower width W6A (e.g., a first width) of the air gap AG6 is defined by the upper wiring structure 160 and the side wall of the conductive capping layer 550T that faces the upper wiring structure 160, and an upper width W6B (e.g., a second width) of the air gap AG6 is defined by the upper wiring structure 160 and the side wall of the first insulating capping layer 650A that faces the upper wiring structure 160. The lower width W6A and the upper width W6B of the air gap AG6 have different sizes. For example, as shown in FIG. 6, in an exemplary embodiment, the lower width W6A is larger than the upper width W6B. However, exemplary embodiments of the inventive concept are not limited thereto. For example, in an exemplary embodiment, the upper width W6B is larger than the lower width W6A. Each of the lower and upper widths W6A and W6B of the air gap AG6 may have a size within a range from about 2 nm to about 10 nm. In an exemplary embodiment, a height of the air gap AG6 is defined by the lower metal film 136 and the second insulating capping layer 250B. For example, in an exemplary embodiment, the height of the air gap AG6 corresponds to a sum of the thickness D5 of the conductive capping layer 550T and a thickness D6 of the first insulating capping layer 650A.

In an exemplary embodiment, the air gap AG6 is provided at a corner region defined by the top surface of the lower metal film 136 and the side wall of the upper wiring structure 160. For example, the air gap AG6 is disposed in a region at which the top surface of the lower metal film 136 meets the side wall of the upper wiring structure 160, as shown in FIG. 6. The air gap AG6 may have, for example, any one of the planar forms of the air gap AG1 shown in FIGS. 1B through 1E. However, the air gap AG6 is not limited thereto.

Figure 7:
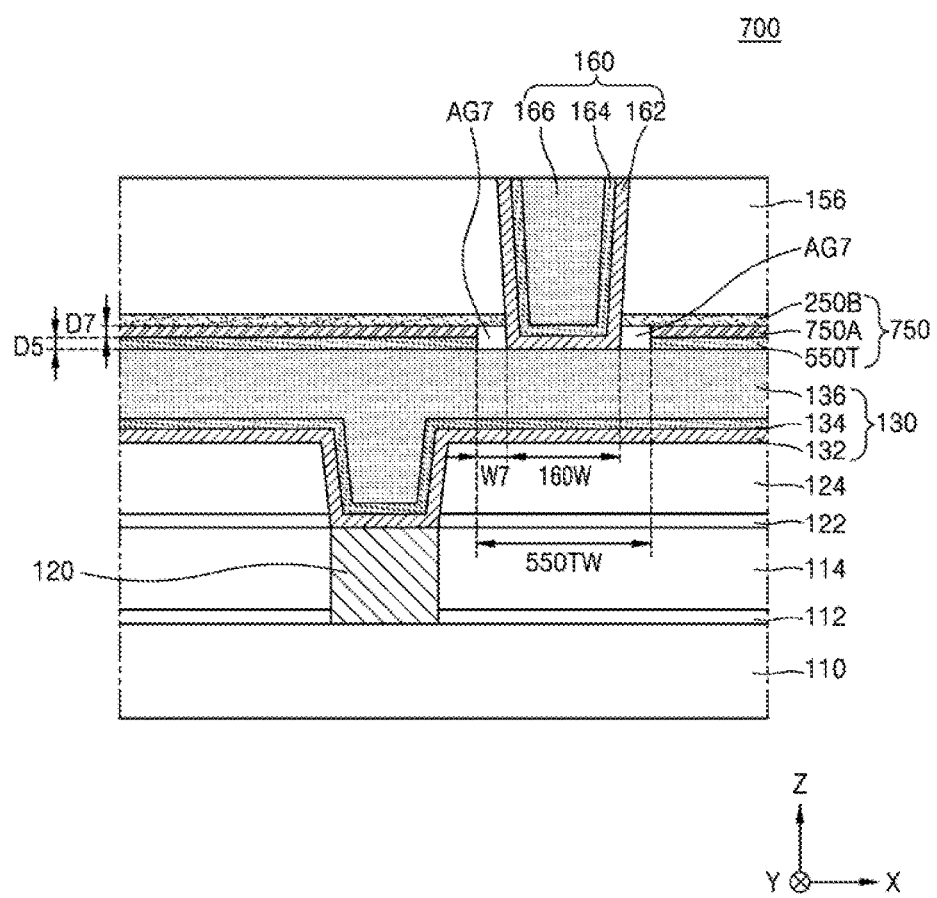

FIG. 7 is a cross-sectional view of an integrated circuit device 700, according to an exemplary embodiment of the inventive concept.

Referring to FIG. 7, the integrated circuit device 700 has substantially the same structure as the integrated circuit device 600 of FIG. 6. In the integrated circuit device 700 of FIG. 7, the top surface of the lower metal film 136 is covered by a capping layer 750. The capping layer 750 includes the conductive capping layer 550T, a first insulating capping layer 750A that includes a metal, and the second insulating capping layer 250B that does not include a metal. The capping layer 750 is similar to the capping layer 650 of FIG. 6, except that the side wall of the conductive capping layer 550T that faces the upper wiring structure 160, and a side wall of the first insulating capping layer 750A that faces the upper wiring structure 160, together form one flat plane, without any stepped portion therebetween in the capping layer 750.

An air gap AG7 is disposed between the lower metal film 136 and the second insulating capping layer 250B. In an exemplary embodiment, the air gap AG7 has a width W7 that is about the same between the conductive capping layer 550T and the upper wiring structure 160, and between the first insulating capping layer 750A and the upper wiring structure 160. The width W7 of the air gap AG7 may be from about 2 nm to about 10 nm. The air gap AG7 has a height corresponding to a sum of the thickness D5 of the conductive capping layer 550T and a thickness D7 of the first insulating capping layer 750A.

In an exemplary embodiment, the air gap AG7 is disposed at a corner region defined by the top surface of the lower metal film 136 and the side wall of the upper wiring structure 160. For example, the air gap AG7 is disposed in a region at which the top surface of the lower metal film 136 meets the side wall of the upper wiring structure 160, as shown in FIG. 7. The air gap AG7 may have, for example, any one of the planar forms of the air gap AG1 shown in FIGS. 1B through 1E. However, the air gap AG7 is not limited thereto.

Figure 8A:
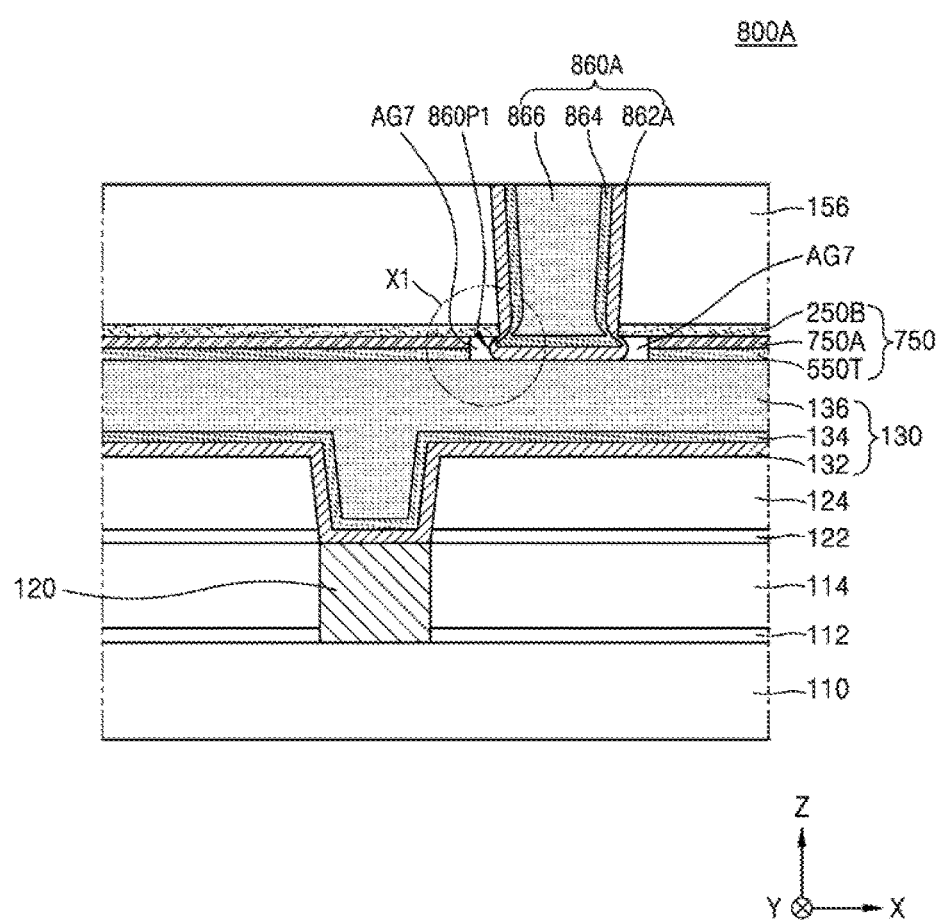
FIG. 8A is a cross-sectional view of an integrated circuit device, according to an exemplary embodiment of the inventive concept.
Figure 8B:
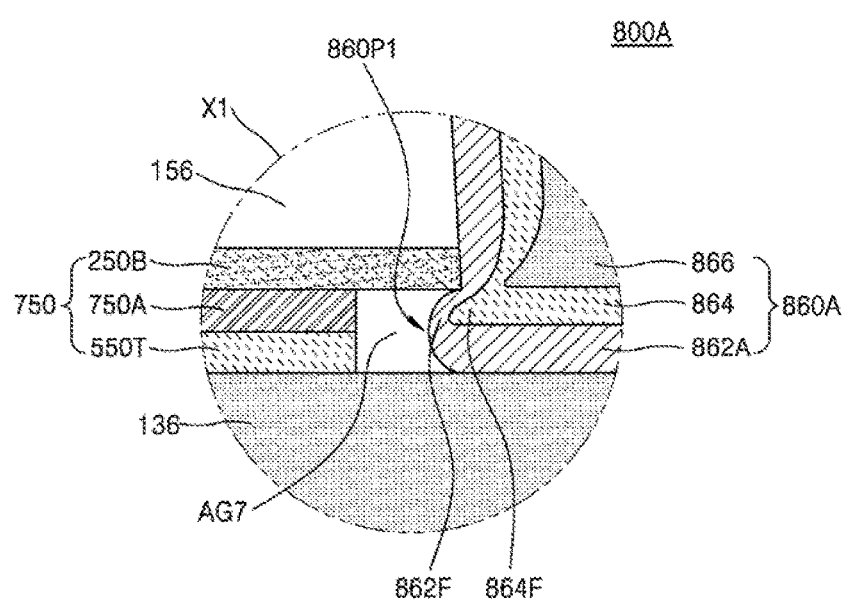
FIG. 8B is an enlarged cross-sectional view of a region indicated by X1 in FIG. 8A, according to an exemplary embodiment of the inventive concept.

FIG. 8A is a cross-sectional view of an integrated circuit device 800A, according to an exemplary embodiment of the inventive concept. FIG. 8B is an enlarged cross-sectional view of a region indicated by X1 in FIG. 8A, according to an exemplary embodiment of the inventive concept.

Referring to FIGS. 8A and 8B, the integrated circuit device 800A has substantially the same structure as the integrated circuit device 700 of FIG. 7. However, in the integrated circuit device 800A of FIGS. 8A and 8B, an upper wiring structure 860A includes a protruding portion 860P1 that protrudes into the air gap AG7. The upper wiring structure 860A further includes an upper conductive barrier film 862A, an upper metal liner 864, and an upper metal film 866, at least a portion of which may be shaped so as to protrude into the air gap AG7 at the protruding portion 860P1. Details regarding the upper conductive barrier film 862A, the upper metal liner 864, and the upper metal film 866 are the same as or similar to those described above with respect to the upper conductive barrier film 162, the upper metal liner 164, and the upper metal film 166 of FIG. 3.

The upper conductive barrier film 862A and the upper metal liner 864 respectively include a local region 862F and 864F that face the air gap AG7 at the protruding portion 860P1. At least portions of the local regions 862F and 864F have a thickness smaller than portions of the upper conductive barrier film 862A and the upper metal liner 864 that face the second insulating film 156. The local regions 862F and 864F externally protrude farther from the upper wiring structure 860A than the portions of the upper conductive barrier film 862A and the upper metal liner 864 that face the second insulating film 156. For example, in an exemplary embodiment, the upper conductive barrier film 862A includes a first portion that faces the second insulating film 156 and that has a first thickness, and a second portion that faces the air gap AG7 and that has a second thickness smaller than the first thickness, as shown in FIGS. 8A and 8B. In an exemplary embodiment, the second portion externally protrudes farther than the first portion from a center of the upper wiring structure 860A.

Figure 9:
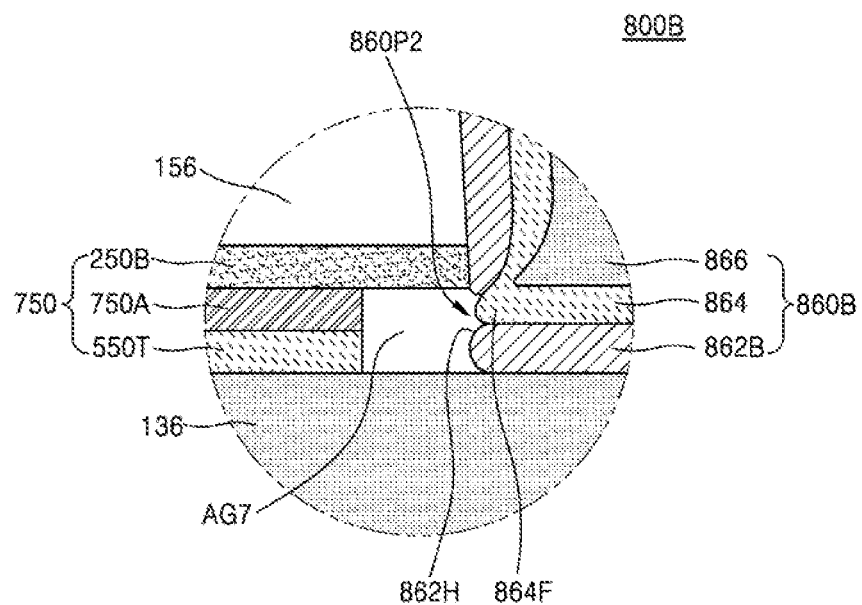
FIGS. 9 and 10 are enlarged cross-sectional views of the region indicated by X1 in FIG. 8A, according to exemplary embodiments of the inventive concept.
Figure 10:
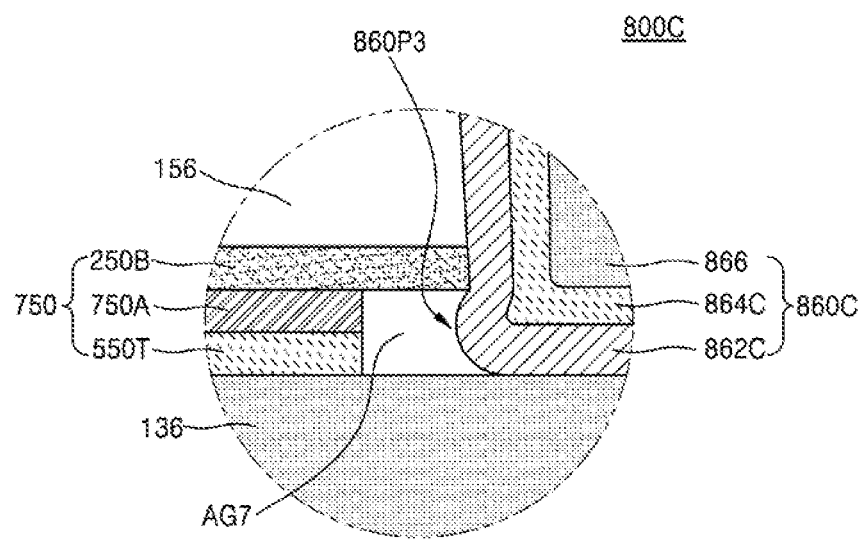

FIGS. 9 and 10 are cross-sectional views of components of integrated circuit devices 800B and 800C, according to exemplary embodiments of the inventive concept. FIGS. 9 and 10 are enlarged cross-sectional views of the region indicated by X in FIG. 8A, according to exemplary embodiments of the inventive concept.

Referring to FIG. 9, the integrated circuit device 800B has substantially the same structure as the integrated circuit device 700 of FIG. 7. An upper wiring structure 860B includes an upper conductive barrier film 862B, the upper metal liner 864, and the upper metal film 866. However, in the integrated circuit device 800B of FIG. 9, an opening 862H into which the air gap AG7 extends is formed in the upper conductive barrier film 862B of the upper wiring structure 860B. Accordingly, the upper conductive barrier film 862B discontinuously extends at a portion adjacent to the air gap AG7. The upper wiring structure 860B includes a protruding portion 860P2. At the protruding portion 860P2, the local region 864F of the upper metal liner 864 protrudes into the air gap AG7. The protruding portion 860P2 faces the air gap AG7 through the opening 862H of the upper conductive barrier film 862B. Details regarding the upper conductive barrier film 862B are the same as or similar to those regarding the upper conductive barrier film 162 described with reference to FIG. 3.

Referring to FIG. 10, the integrated circuit device 800C has substantially the same structure as the integrated circuit device 700 of FIG. 7. However, in the integrated circuit device 800C of FIG. 10, an upper wiring structure 860C includes a protruding portion 860P3 that protrudes into the air gap AG7. The upper wiring structure 860C includes an upper conductive barrier film 862C, an upper metal liner 864C, and the upper metal film 866. At least one of the upper conductive barrier film 862C, the upper metal liner 864C, and the upper metal film 866 is shaped to protrude towards the air gap AG7. Details regarding the upper conductive barrier film 862C, the upper metal liner 864C, and the upper metal film 866 are the same as or similar to those regarding the upper conductive barrier film 162, the upper metal liner 164, and the upper metal film 166 described with reference to FIG. 3. According to an exemplary embodiment, the upper conductive barrier film 862C has a substantially uniform thickness among locations in which it is formed. For example, a thickness of the upper conductive barrier film 862C at the protruding portion 860P3 that faces the air gap AG7 may be substantially the same as a thickness of the upper conductive barrier film 862C at a portion that faces the second insulating film 156. Portions of the upper conductive barrier film 862C and the upper metal liner 864C that form the protruding portion 860P3 externally protrude farther from the upper wiring structure 860C than portions of the upper conductive barrier film 862C and the upper metal liner 864C that face the second insulating film 156.

Figure 11:
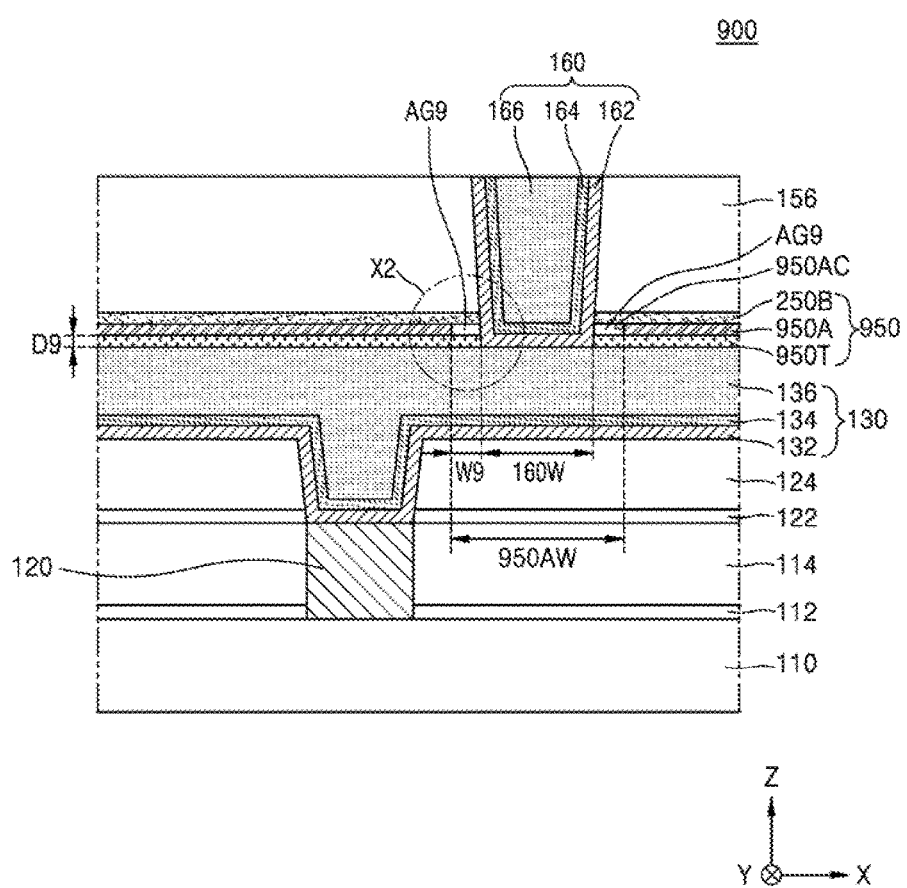
FIG. 11 is a cross-sectional view of an integrated circuit device, according to an exemplary embodiment of the inventive concept.

FIG. 11 is a cross-sectional view of an integrated circuit device 900, according to an exemplary embodiment of the inventive concept.

Referring to FIG. 11, the integrated circuit device 900 has substantially the same structure as the integrated circuit device 400 of FIG. 4. However, in the integrated circuit device 900 of FIG. 11, the top surface of the lower metal film 136 is covered by a capping layer 950. The capping layer 950 has a structure in which a conductive alloy capping layer 950T, a first insulating capping layer 950A that includes a metal, and the second insulating capping layer 250B that do not include a metal are sequentially stacked on one another.

The conductive alloy capping layer 950T may include a metal or alloy including Co, Ni, Ta, Ru, W, Mn, or a combination thereof, and an alloy of a semiconductor element including Si or Ge. According to an exemplary embodiment, the conductive alloy capping layer 950T may be formed of a material represented by $M_xA_y$, wherein M denotes a metal, A denotes Si or Ge, x denotes an integer from 1 to 6, and y denotes an integer from 1 to 10.

For example, the conductive alloy capping layer 950T may be formed of CoSi, $CoSi_2$, $Co_2Si$, $Co_3Si$, CoGe, $CoGe_2$, $CoGe_3$, $CoGe_7$, or $Co_4Ge$. The first insulating capping layer 950A may be formed of AlN, AlON, AlO, or AlOC. The second insulating capping layer 250B may include SiC, SiN, SiC:N, or SiOC. The capping layer 950 is covered by the second insulating film 156. The upper wiring structure 160 extends such that it penetrates the second insulating film 156 and the capping layer 950, and is electrically connected to the lower metal film 136.

An air gap AG9 is disposed between the lower metal film 136 and the second insulating film 156. For example, the air gap AG9 is disposed between the conductive alloy capping layer 950T and the second insulating capping layer 250B. In an exemplary embodiment, a width W9 of the air gap AG9 is defined by the first insulating capping layer 950A and the upper wiring structure 160. The width W9 of the air gap AG9 may be from about 2 nm to about 10 nm. In an exemplary embodiment, a height of the air gap AG9 is defined by the conductive alloy capping layer 950T and the second insulating capping layer 250B. For example, in an exemplary embodiment, the height of the air gap AG9 corresponds to a thickness D9 of the first insulating capping layer 950A.

The air gap AG9 may be disposed between the conductive alloy capping layer 950T and the second insulating capping layer 250B, adjacent to the side wall of the upper wiring structure 160, and near a corner region defined by the top surface of the lower metal film 136 and the side wall of the upper wiring structure 160. The air gap AG9 may have, for example, any one of the planar forms of the air gap AG1 shown in FIGS. 1B through 1E. However, the air gap AG9 is not limited thereto.

In an exemplary embodiment, the conductive alloy capping layer 950T and the second insulating capping layer 250B of the capping layer 950 contact the side wall of the upper wiring structure 160. In an exemplary embodiment, the first insulating capping layer 950A includes a cutout region 950AC having a width 950AW larger than the width 160W of the bottom surface of the upper wiring structure 160, and a volume of the air gap AG9 is about equal to that of the cutout region 950AC excluding a portion occupied by the upper wiring structure 160.

FIGS. 12 through 16 are cross-sectional views of integrated circuit devices 900A through 900E according to exemplary embodiments of the inventive concept. FIGS. 12 through 16 are enlarged cross-sectional views of a region indicated by X2 in FIG. 11.

Figure 12:
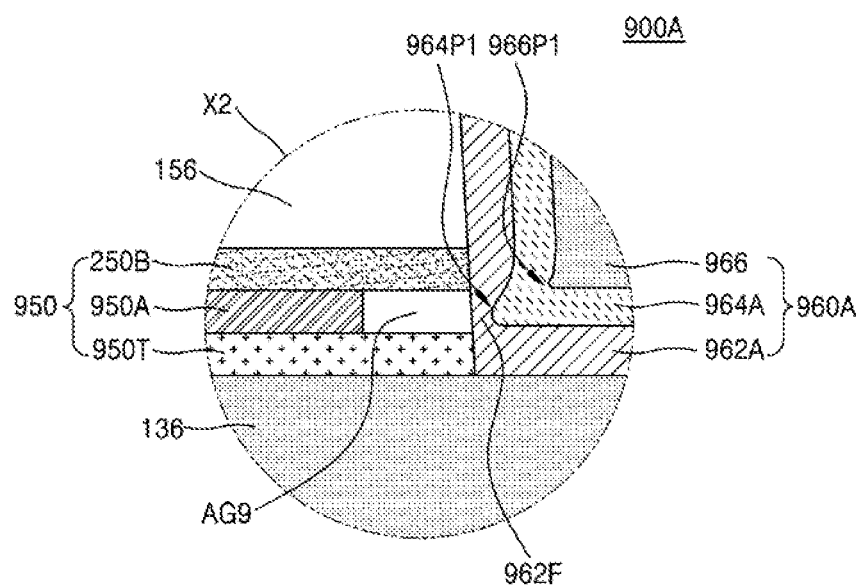
FIGS. 12 through 16 are enlarged cross-sectional views of the region indicated by X2 in FIG. 11, according to exemplary embodiments of the inventive concept.

Referring to FIG. 12, the integrated circuit device 900A has substantially the same structure as the integrated circuit device 900 of FIG. 11. However, an upper wiring structure 960A of the integrated circuit device 900A includes an upper conductive barrier film 962A, an upper metal liner 964A, and an upper metal film 966. The upper conductive barrier film 962A has a reduced thickness at a local region 962F that faces the air gap AG9. The upper metal liner 964A and the upper metal film 966 respectively include protruding portions 964P1 and 966P1 that protrude towards the air gap AG9.

Figure 13:
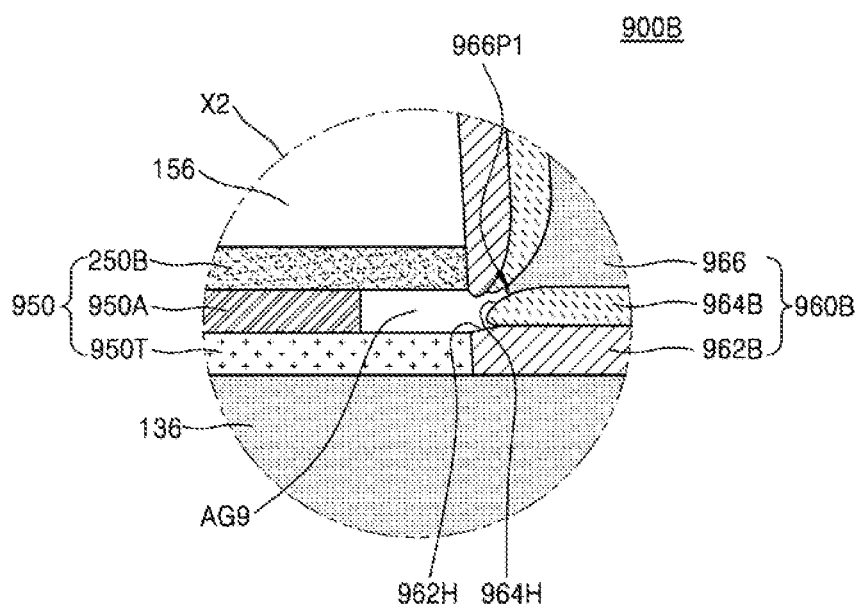

Referring to FIG. 13, the integrated circuit device 900B has substantially the same structure as the integrated circuit device 900 of FIG. 11. However, an upper wiring structure 960B of the integrated circuit device 900B includes an upper conductive barrier film 962B, an upper metal liner 964B, and the upper metal film 966. The upper conductive barrier film 962B and the upper metal liner 964B respectively include openings 962H and 964H into which the air gap AG9 extends. The upper metal film 966 includes the protruding portion 966P1 that protrudes towards the air gap AG9. The protruding portion 966P1 is exposed inside the air gap AG9.

Figure 14:
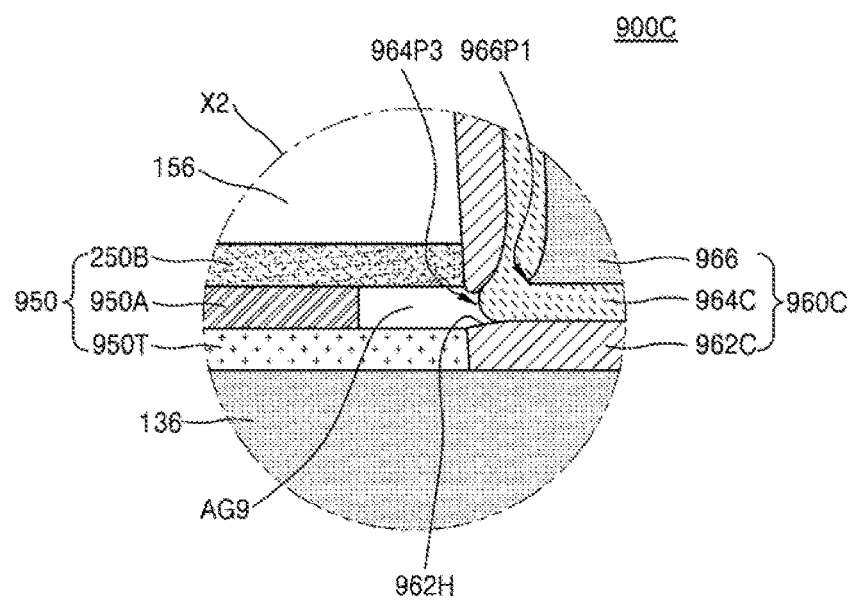

Referring to FIG. 14, the integrated circuit device 900C has substantially the same structure as the integrated circuit device 900 of FIG. 11. However, an upper wiring structure 960C of the integrated circuit device 900C includes an upper conductive barrier film 962C, an upper metal liner 964C, and the upper metal film 966. The upper conductive barrier film 962C includes the opening 962H into which the air gap AG9 extends. The upper metal liner 964C and the upper metal film 966 respectively include protruding portions 964P3 and 966P1 that protrude towards the air gap AG9. The protruding portion 964P3 of the upper metal liner 964B may be exposed inside the air gap AG9.

Figure 15:
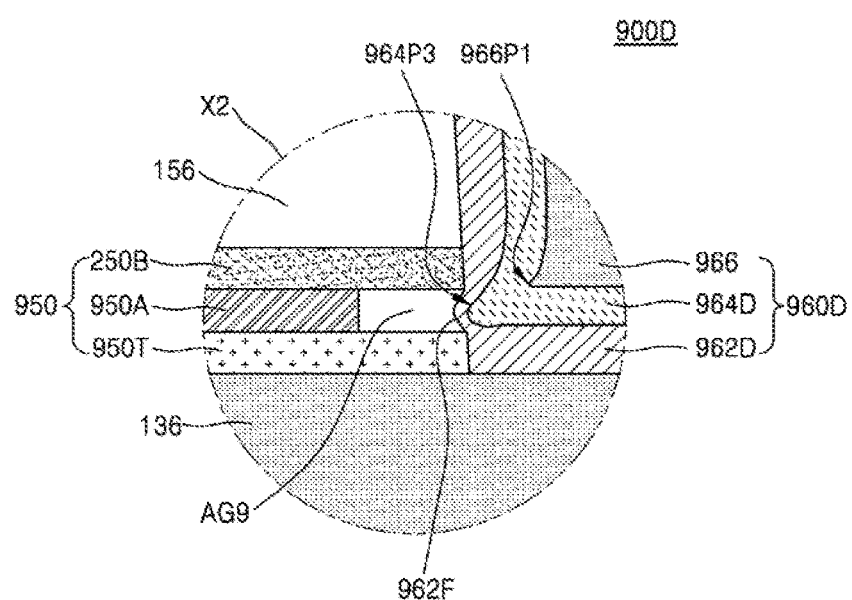

Referring to FIG. 15, the integrated circuit device 900D has substantially the same structure as the integrated circuit device 900 of FIG. 11. However, an upper wiring structure 960D of the integrated circuit device 900D includes an upper conductive barrier film 962D, an upper metal liner 964D, and the upper metal film 966. The upper conductive barrier film 962D includes the local region 962F that faces the air gap AG9. At least a portion of the local region 962F has a thickness smaller than a portion of the upper conductive barrier film 962D that faces the second insulating film 156. The upper metal liner 964D and the upper metal film 966 respectively include the protruding portions 964P3 and 966P1 that protrude towards the air gap AG9.

Figure 16:
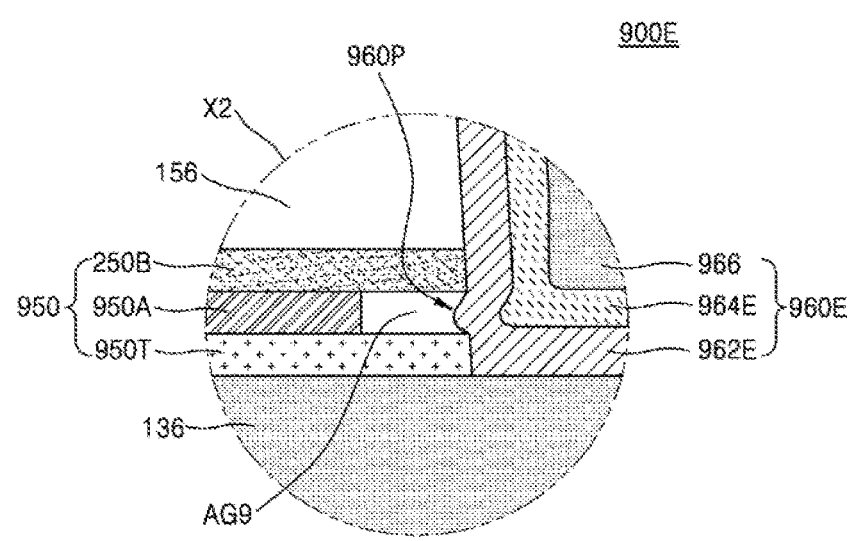

Referring to FIG. 16, the integrated circuit device 900E has substantially the same structure as the integrated circuit device 900 of FIG. 11. However, an upper wiring structure 960E of the integrated circuit device 900E includes a protruding portion 960P that protrudes into the air gap AG9. The upper wiring structure 960E includes an upper conductive barrier film 962E, an upper metal liner 964E, and the upper metal film 966. At least a portion of the upper conductive barrier film 962E, the upper metal liner 964E, and the upper metal film 966 is shaped so as to protrude towards the air gap AG9 at the protruding portion 960P. A thickness of the upper conductive barrier film 962E at the protruding portion 960P that faces the air gap AG9 may be about the same as a thickness of the upper conductive barrier film 962E at a portion that faces the second insulating film 156.

Details regarding the upper conductive barrier films 962A, 962B, 962C, 962D, and 962E, the upper metal liners 964A, 964B, 964C, 964D, and 964E, and the upper metal film 966 of FIGS. 12 through 16, are the same as or similar to those regarding the upper conductive barrier film 162, the upper metal liner 164, and the upper metal film 166 described above with reference to FIG. 3.

Figure 17:
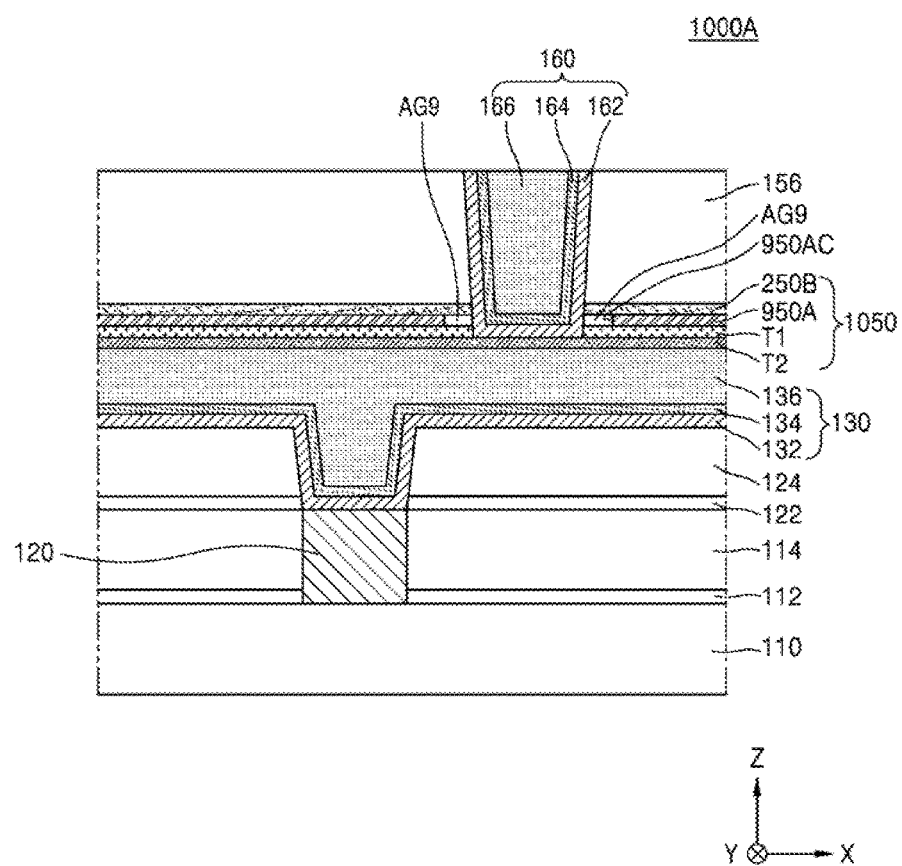
FIGS. 17 and 18 are cross-sectional views of integrated circuit devices, according to exemplary embodiments of the inventive concept.
Figure 18:
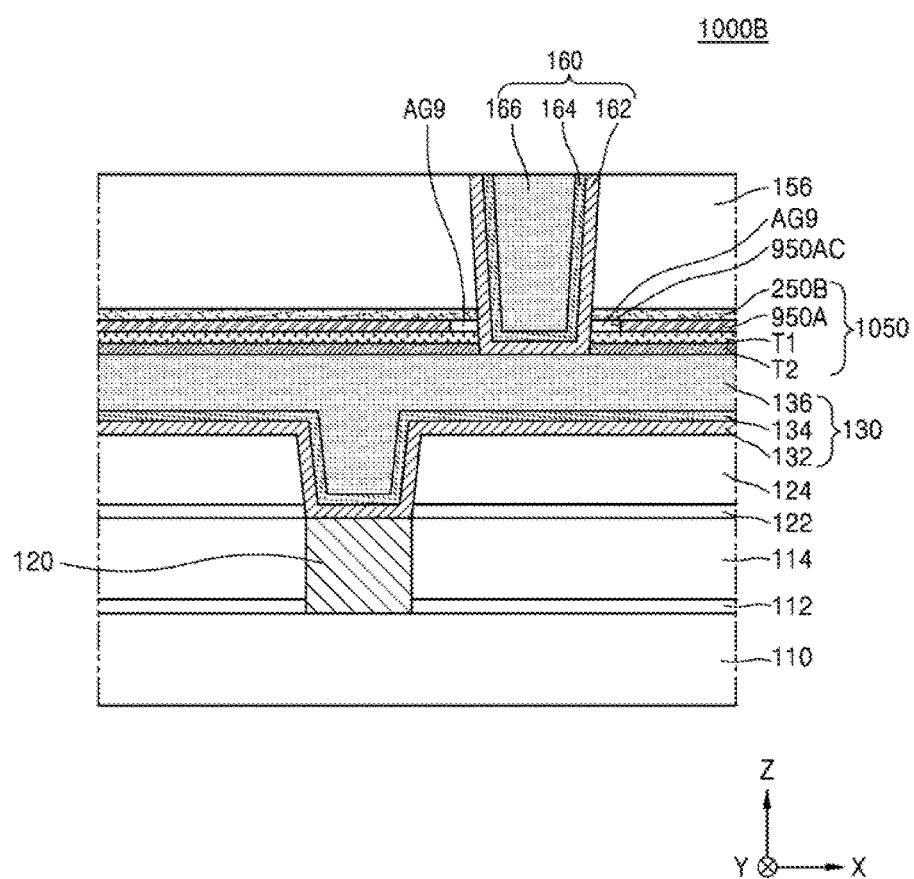

FIGS. 17 and 18 are cross-sectional views of integrated circuit devices 1000A and 1000B, according to exemplary embodiments of the inventive concept.

Referring to FIGS. 17 and 18, the integrated circuit devices 1000A and 1000B have substantially the same structure as the integrated circuit device 400 of FIG. 11. However, in the integrated circuit device 1000A in FIG. 17, the lower metal film 136 is covered by a capping layer 1050 that includes a first conductive alloy capping layer T1 and a second conductive alloy capping layer T2. The capping layer 1050 includes the second conductive alloy capping layer T2, the first conductive alloy capping layer T1, the first insulating capping layer 950A, and the second insulating capping layer 250B, which are sequentially stacked over the lower metal film 136. The first conductive alloy capping layer T1 has substantially the same structure as the conductive alloy capping layer 950T described with reference to FIG. 11. The second conductive alloy capping layer T2 includes a metal different from a metal included in the first conductive alloy capping layer T1, and an alloy of a semiconductor element including Si or Ge. According to an exemplary embodiment, the second conductive alloy capping layer T2 may include CuSi, Cu$_3$Si, CuGe, or Cu$_3$Ge. The capping layer 1050 is covered by the second insulating film 156. According to an exemplary embodiment, the second conductive alloy capping layer T2 includes a third metal that is different from a first metal included in the first conductive alloy capping layer T1, which is different from a second metal included in the first insulating capping layer 950A.

In the integrated circuit device 1000A of FIG. 17, the second conductive alloy capping layer 12 is disposed between the lower metal film 136 and the upper wiring structure 160 such that the upper wiring structure 160 is electrically connected to the lower metal film 136 through the second conductive alloy capping layer T2. The upper wiring structure 160 penetrates the second insulating film 156, the second insulating capping layer 250B, the first insulating capping layer 950A, and the first conductive alloy capping layer T1, and extends down to a top surface of the second conductive alloy capping layer T2.

In the integrated circuit device 1000B of FIG. 18, the upper wiring structure 160 directly contacts the lower metal film 136. The upper wiring structure 160 penetrates the second insulating film 156, the second insulating capping layer 250B, the first insulating capping layer 950A, the first conductive alloy capping layer T1, and the second conductive alloy capping layer T2, and extends down to the top surface of the lower metal film 136.

In comparative examples, when a multilayered wiring structure of an integrated circuit device is formed over a substrate, the multilayered wiring structure may become detached or cracked due to a stress difference between the multilayered wiring structure and the substrate, or due to relatively weak adhesion between different neighboring layers in the multilayered wiring structure. Detachment or cracking generated in the multilayered wiring structure may spread along an interface between wiring structures and insulating films that insulate the wiring structures. When detachment or cracking generated in the multilayered wiring structure spread, an operational malfunction or lifespan deterioration of the integrated circuit device may occur, thus, decreasing the reliability of the integrated circuit device.

Integrated circuit devices according to exemplary embodiments of the inventive concept described above with reference to FIGS. 1A through 18 include an air gap formed in or near a corner region defined by a top surface of a lower metal film forming a lower wiring structure and a side wall of an upper wiring structure. The air gap has a size in which a width is defined by a capping layer covering the top surface of the lower metal film and the upper wiring structure. Accordingly, even if detachment or cracking is generated in the lower wiring structure, the upper wiring structure, insulating films surrounding the lower and upper wiring structures, or an interface therebetween, when the detachment or cracking reaches the air gap, the detachment or cracking may stop spreading at the air gap.

Accordingly, in integrated circuit devices according to exemplary embodiments, even when detachment or cracking is generated in a multilayered wiring structure, the detachment or cracking is blocked from spreading, thereby preventing an operational malfunction or lifespan deterioration of the integrated circuit devices from occurring, thus, increasing reliability of the integrated circuit devices.

FIGS. 19A through 19F are cross-sectional views illustrating a method of manufacturing an integrated circuit device, according to an exemplary embodiment of the inventive concept. An example of a method of manufacturing the integrated circuit device 500 of FIG. 5 will be described with reference to FIGS. 19A through 19F. Referring to FIGS. 19A through 19F, a further description of elements previously described may be omitted.

Figure 19A:
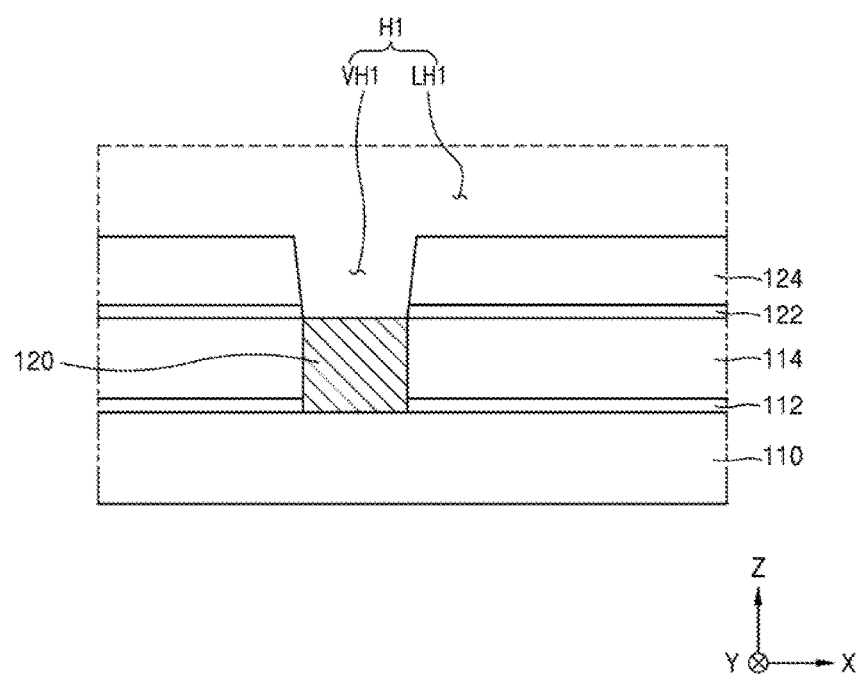
FIGS. 19A through 19F are cross-sectional views illustrating a method of manufacturing an integrated circuit device, according to an exemplary embodiment of the inventive concept.

Referring to FIG. 19A, the first etch-stop layer 112 and the lower insulating film 114 are formed over the substrate 110, and the lower conductive film 120 is electrically connected to a conductive region of the substrate 110 by penetrating the lower insulating film 114 and the first etch-sop layer 112.

The second etch-stop layer 122 and the first insulating film 124 are formed over the lower insulating film 114, and a first hole H1 is formed penetrating the first insulating film 124 and the second etch-stop layer 122 so as to expose the lower conductive film 120. In an exemplary embodiment, the first hole H1 includes a first via hole VH1 and a first line hole LH1. In an exemplary embodiment, the first via hole VH1 extends from the first line hole LH1. To form the first hole H1, the first insulating film 124 and the second etch-stop film 122 may be dry-etched by using a plurality of etch mask patterns having different etch selectivities. In FIG. 19A, a region corresponding to the first line hole LH1 is shown by a dashed line.

Figure 19B:
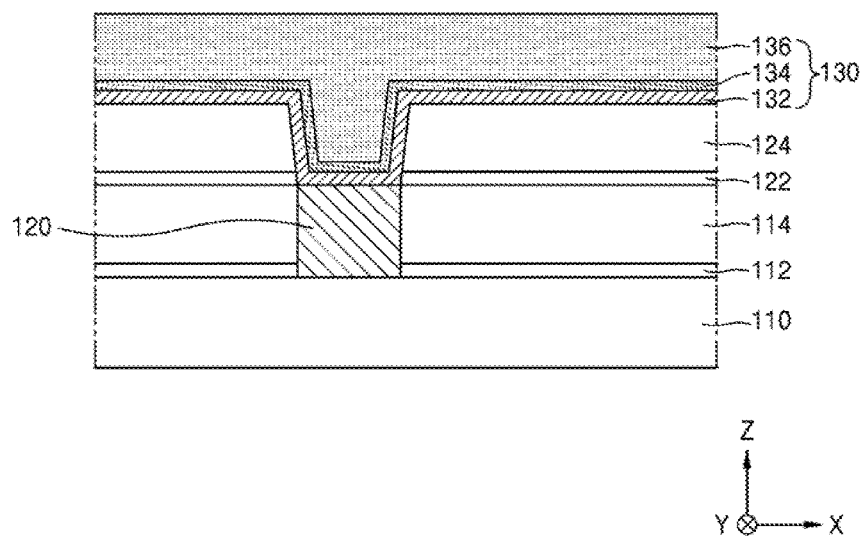

Referring to FIG. 19B, the lower wiring structure 130 filling the first hole H1 is formed by sequentially forming the lower conductive barrier film 132, the lower metal liner 134, and the lower metal film 136 inside the first hole H1 (see FIG. 19A).

According to an exemplary embodiment, to form the lower metal film 136, the lower metal liner 134 is formed over the lower conductive barrier film 132, a metal seed layer is formed over the lower metal liner 134, and a plating process is then performed. To form the lower conductive barrier film 132, the lower metal liner 134, and the metal seed layer, a process including physical vapor deposition (PVD), chemical vapor deposition (CVD), atomic layer deposition (ALD), or a combination thereof may be used. According to an exemplary embodiment, to form the lower metal film 136, PVD, CVD, or ALD may be performed instead of the plating process. Then, the lower metal film 136, the lower metal liner 134, and the lower conductive barrier film 132 are etched and planarized using, for example, a chemical mechanical polishing (CMP) process and/or an etch-back process, such that a top surface of the first insulating film 124 is exposed at the periphery of the first hole H1 (see FIG. 19A), and the lower conductive barrier film 132, the lower metal liner 134, and the lower metal film 136 are left in the first hole H1.

Figure 19C:
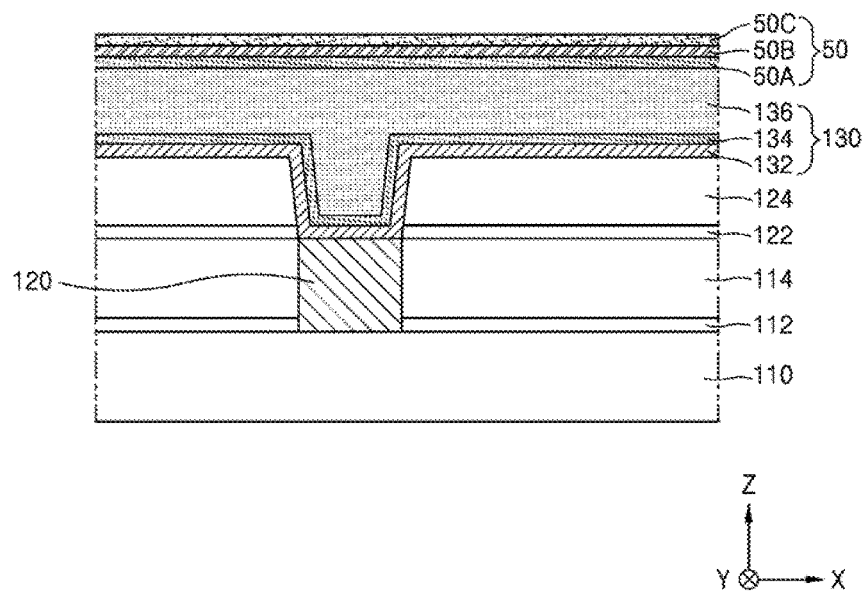

Referring to FIG. 19C, a preliminary capping layer 50 is formed over the lower metal film 136. To form the preliminary capping layer 50, a first preliminary capping layer 50A, a second preliminary capping layer 50B, and a third preliminary capping layer 50C are sequentially formed over the lower wiring structure 130. In addition to covering the top surface of the lower wiring structure 130, in an exemplary embodiment, the second preliminary capping layer 50B and the third preliminary capping layer 50C also cover the top surface of the first insulating film 124 around the lower wiring structure 130.

In an exemplary embodiment, the first preliminary capping layer 50A includes a conductive layer. In an exemplary embodiment, the first preliminary capping layer 50A is not formed over exposed surfaces of the first insulating film 124 and lower conductive barrier film 132, and is selectively formed only over exposed surfaces of the lower metal film 136 and lower metal liner 134. A selective CVD process may be used to form the first preliminary capping layer 50A. According to an exemplary embodiment, during a deposition process for forming the first preliminary capping layer 50A, a metal forming the first preliminary capping layer 50A is deposited only on the exposed surfaces of the lower metal film 136 and lower metal liner 134 via a self-assembly method, according to affinity with metals forming the lower metal film 136 and lower metal liner 134. Thus, the first preliminary capping layer 50A is selectively formed only over the exposed surface of each of the lower metal film 136 and the lower metal liner 134. A top surface of the first preliminary capping layer 50A may include, for example, a metal or alloy including Co, Ni, Ta, Ru, W, Mn, or a combination thereof.

In an exemplary embodiment, the second preliminary capping layer 50B includes an insulating layer that includes a metal. For example, the second preliminary capping layer 50B may include AlN, AlON, AlO, or AlOC. A CVD, ALD, or PVD process may be used to form the second preliminary capping layer 50B. According to an exemplary embodiment, after the second preliminary capping layer 50B is formed, a post-treatment annealing process is performed. According to an exemplary embodiment of performing the post-treatment annealing process, a resulting structure obtained by forming the second preliminary capping layer 50B is annealed under an $N_2$ gas atmosphere, and then annealed under an $H_2$ gas atmosphere. According to an exemplary embodiment of performing the post-treatment annealing process, the resulting structure obtained by forming the second preliminary capping layer 50B is annealed under an $NH_3$ and $N_2$ mixture gas atmosphere. While the post-treatment annealing process is performed, radio frequency (RF) power may be applied to create a plasma atmosphere. The post-treatment annealing process may be performed for about 30 seconds at a temperature of about 360° C. under pressure of about 2.4 torr. However, such conditions merely exemplary, and the inventive concept is not limited thereto. By performing such a post-treatment annealing process on the second preliminary capping layer 50B, etch-resistance of the second preliminary capping layer 50B with respect to an etchant or a cleaning solution that may contact the second preliminary capping layer 50B during a following process may be increased.

In an exemplary embodiment, the third preliminary capping layer 50C includes an insulating layer that does not include a metal. For example, the third preliminary capping layer 50C may include SiC, SiN, SiC:N, or SiOC. A CVD, ALD, or PVD process may be used to form the third preliminary capping layer 50C.

Figure 19D:
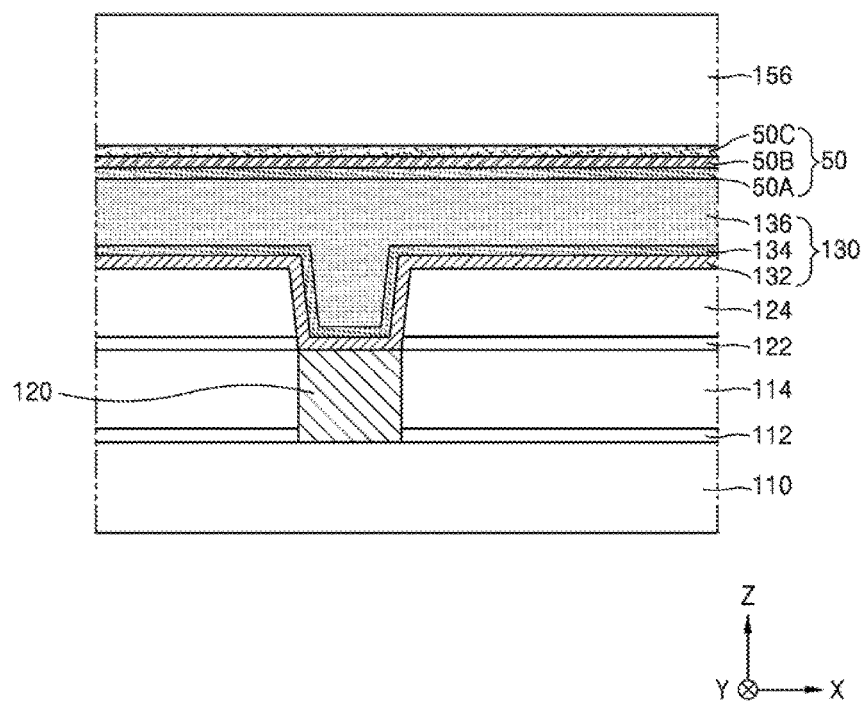

Referring to FIG. 19D, the second insulating film 156 is formed over the preliminary capping layer 50. In an exemplary embodiment, the second insulating film 156 is formed to cover the top surface of the lower wiring structure 130 and the top surface of the first insulating film 124 around the lower wiring structure 130, with the preliminary capping layer 50 interposed therebetween.

Figure 19E:
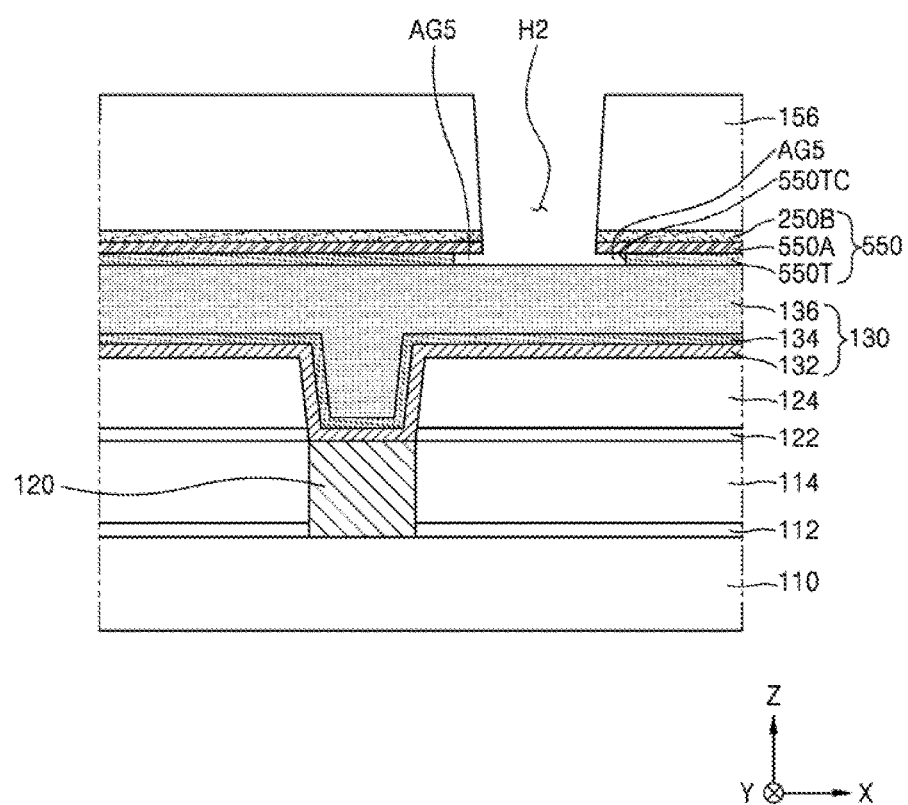

Referring to FIGS. 19D and 19E, the second insulating film 156 is etched using the preliminary capping layer 50 as an etch-stop film. A portion of the preliminary capping layer 50 is then etched to form a second hole H2 exposing the lower metal film 136 of the lower wiring structure 130, as well as the air gap AG5, which extends from the second hole H2. As a result, the capping layer 550 including remaining portions of the preliminary capping layer 50 is obtained.

The second hole H2 penetrates the second insulating film 156 and the capping layer 550 in a vertical direction (Z-direction). To form the air gap AG5, a portion of the preliminary capping layer 50 exposed through the second hole H2 is removed along a horizontal direction (X-direction and/or Y-direction) to form the cutout region 550TC, which extends from the second hole H2. A portion of the cutout region 550TC forms the air gap AG5 (e.g., the air gap AG5 is disposed in the cutout region 550TC). For example, the cutout region 550TC is formed by removing a portion of the capping layer 550 in a direction (e.g., the X-direction) that is substantially perpendicular to the direction (e.g., the Z-direction) in which the second hole H2 penetrates the second insulating film 156.

According to an exemplary embodiment of forming the second hole H2 and the air gap AG5, the second insulating film 156 and the third preliminary capping layer 50C are dry-etched by using a plasma etching process or a reactive-ion etching (RIE) process. An etching speed may be reduced by the third preliminary capping layer 50C, and the second preliminary capping layer 50B that includes a material different from that of the third preliminary capping layer 50C may be used as an etching endpoint. The exposed second preliminary capping layer 50B is then wet-etched to expose the first preliminary capping layer 50A, and a portion of the first preliminary capping layer 50A is then selectively etched through the second hole H2 using an etch selectivity difference between the exposed first preliminary capping layer 50A and different layers exposed inside and outside the second hole H2. As a result, the cutout region 550TC is formed in the first preliminary capping layer 50A. A wet-etching process may be used to form the cutout region 550TC.

According to an exemplary embodiment, when the second preliminary capping layer 50B includes an AlN layer, a process of etching the second preliminary capping layer 50B to form the second hole H2 and a process of etching the first preliminary capping layer 50A to form the cutout region 550TC are performed by using the same etchant. In an exemplary embodiment, etch selectivity of the first preliminary capping layer 50A is higher than etch selectivity of the second preliminary capping layer 50B, with respect to the etchant. Accordingly, when the second preliminary capping layer 50B and the first preliminary capping layer 50A therebelow are etched using the same etchant, an etching amount of the first preliminary capping layer 50A is larger than an etching amount of the second preliminary capping layer 50B. Accordingly, the cutout region 550TC is formed in the first preliminary capping layer 50A after the second hole H2 is formed, and the cutout region 550TC including the air gap AG5 remains. An acid solution such as, for example, a sulfuric acid or hydrochloric acid solution, may be used as the etchant for etching the second preliminary capping layer 50B and the first preliminary capping layer 50A therebelow.

According to an exemplary embodiment, when the second preliminary capping layer 50B includes an AlON layer, the first preliminary capping layer 50A is exposed by dry-etching the second preliminary capping layer 50B, and the second hole H2 and the cutout region 550TC are then formed by wet-etching the exposed first preliminary capping layer 50A by using an acid solution such as, for example, a sulfuric acid or hydrochloric acid solution.

Figure 19F:
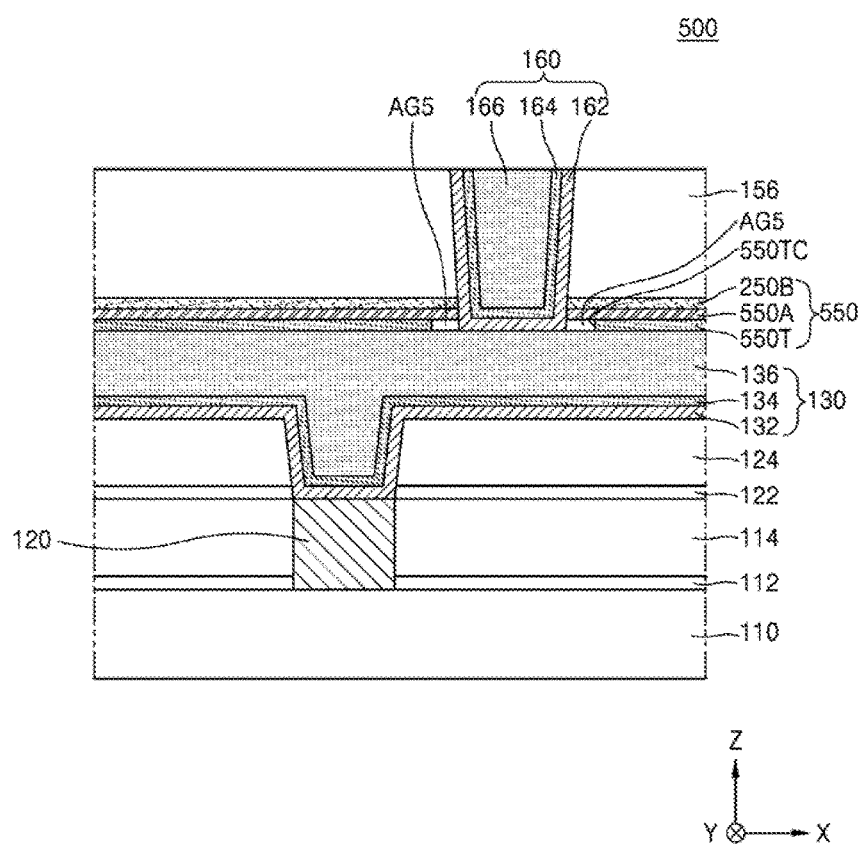

Referring to FIG. 19F, the upper wiring structure 160 filling the second hole H2 is formed by sequentially forming the upper conductive barrier film 162, the upper metal liner 164, and the upper metal film 166 inside the second hole H2 (see FIG. 19E). According to an exemplary embodiment, a plating process is performed to form the upper metal film 166. Formation of the upper wiring structure 160 in the second hole H2 results in the formation of the air gap AG5 in the cutout region 550TC between the upper wiring structure 160 and a portion of the capping layer 550.

An example of the method of manufacturing the integrated circuit device 500 of FIG. 5 has been described with reference to FIGS. 19A through 19F. It is to be understood that the integrated circuit devices 100 through 400 and 600 through 1000B of FIGS. 1A through 4 and 6 through 18 may also be manufactured by modifying the method described herein accordingly.

For example, according to exemplary embodiments, to manufacture the integrated circuit devices 100 and 300 of FIGS. 1A and 3, the capping layer 150 is formed instead of the preliminary capping layer 50 during the process described with reference to FIG. 19C. Then, as described with reference to FIG. 19E, after the second hole H2 is formed, the cutout region 150C is formed by partially removing the capping layer 150 exposed through the second hole H2 instead of forming the air gap AG5, thereby forming the air gap AG. Various operation conditions of creating an etching atmosphere of the capping layer 150 may be controlled as required, thereby forming the air gap AG1 having any one of the planar forms of FIGS. 1B through 1E. The upper wiring structure 160 shown in FIGS. 1A and 3 may then be formed as described with reference to FIG. 19F.

According to exemplary embodiments, to manufacture the integrated circuit devices 200 and 400 of FIGS. 2 and 4, the capping layer 250 is formed instead of the preliminary capping layer 50 during the process described with reference to FIG. 19C. Then, as described with reference to FIG. 19E, after the second hole H2 is formed, the cutout region 250AC is formed by selectively partially etching the first insulating capping layer 250A of the capping layer 250 exposed through the second hole H2 instead of forming the air gap AG5, thereby forming the air gap AG2. The upper wiring structure 160 shown in FIGS. 2 and 4 is then formed as described with reference to FIG. 19F.

According to exemplary embodiments, to manufacture the integrated circuit devices 600 and 700 of FIGS. 6 and 7, the processes described with reference to FIGS. 19A through 19F are performed. However, during the processes described with reference to FIGS. 19D and 19E, the first and second preliminary capping layers 50A and 50B of the preliminary capping layer 50 exposed through the second hole H2 are etched together. The air gap AG6 of FIG. 6 or the air gap AG7 of FIG. 7 is formed by adjusting etch selectivity of each of the first and second preliminary capping layers 50A and 50B.

According to exemplary embodiments, to manufacture the integrated circuit devices 800A through 800C of FIGS. 8A through 10, the processes described with reference to FIGS. 19A through 19F are performed. However, processes similar to those for forming the upper wiring structure 160 described with reference to FIG. 19F are performed so as to form the upper wiring structures 860A through 860C. The upper wiring structures 860A through 860C having a desired form are formed by controlling deposition conditions of each of the upper conductive barrier films 862A through 862C, the upper metal liners 864 and 864C, and the upper metal film 866 as required.

According to exemplary embodiments, to manufacture the integrated circuit device 900 of FIG. 11, the capping layer 950 that includes the conductive alloy capping layer 950T is formed instead of the preliminary capping layer 50 during the process described with reference to FIG. 19C. To form the conductive alloy capping layer 950T, the first preliminary capping layer 50A is formed via the same process described with reference to FIG. 19C. The first preliminary capping layer 50A is then primarily annealed under an $H_2$ gas atmosphere or under a mixed gas atmosphere of an $H_2$ gas and an inert gas such as an Ar, He, Ne, or $N_2$ gas. As a result, an unwanted native oxide film remaining on the exposed surface of the first preliminary capping layer 50A is removed via reduction, resolving surface damage. A plasma atmosphere may be created by applying RF power while the primary annealing is performed. The primary annealing may be performed at a temperature from about 300° C. to about 400° C., under pressure from about 1 torr to about 20 torr, and for about 1 second to about 1 minute. However, these conditions are merely exemplary, the inventive concept is not limited thereto. The primarily annealed first preliminary capping layer 50A is then secondarily annealed under a gas atmosphere that includes a semiconductor element, thereby forming the conductive alloy capping layer 950T that includes the semiconductor element from the first preliminary capping layer 50A.

In an exemplary embodiment, after the primary annealing process, the secondary annealing process is performed in-situ without breaking vacuum. The semiconductor element may be, for example, at least one of Si or Ge. A gas including the semiconductor element may include, for example, a Si source, such as $SiH_4$, $Si_2H_6$, $Si(CH_3)_4$, or $SiH_2Cl_2$, and/or a Ge source such as, for example $GeH_4$ or $GeCl_4$. According to an exemplary embodiment, the gas atmosphere that includes the semiconductor element may be a mixed gas atmosphere in which the gas including the semiconductor element and an inert gas such as an Ar, He, Ne, or $N_2$ gas are mixed. Annealing may be performed via a plasma method under the gas environment including the semiconductor element. The annealing process may be performed at a temperature from about 300° C. to about 400° C., under a pressure of about 1 torr to about 20 torr, for about 1 second to about 1 minute, and under the gas environment that includes the semiconductor element. However, these conditions are merely exemplary, and the inventive concept is not limited thereto. Further, in an exemplary embodiment, the air gap AG9 is formed by selectively partially removing the first insulating capping layer 950A of the capping layer 950 to form the cutout region 950AC, instead of forming the air gap AG5 during the process described with reference to FIG. 19E. The upper wiring structure 160 is then formed as described with reference to FIG. 19F.

According to exemplary embodiments, to manufacture the integrated circuit devices 900A through 900E of FIGS. 12 through 16, the processes described with reference to FIGS. 19A through 19F are performed. However, processes similar to those of forming the upper wiring structure 160 described with reference to FIG. 19F are performed so as to form the upper wiring structures 960A through 960E. The upper wiring structures 960A through 960E having a desired form are formed by controlling deposition conditions of each of the upper conductive barrier films 962A through 962E, the upper metal liners 964A through 964E, and the upper metal film 966 as required.

According to exemplary embodiments, to manufacture the integrated circuit device 1000A of FIG. 17, a method similar to that described with reference to the integrated circuit device 900 of FIG. 11 may be used. However, the capping layer 1050 that includes the first conductive alloy capping layer T1 and the second conductive alloy capping layer T2 is formed instead of forming the capping layer 950 that includes the conductive alloy capping layer 950T. In this regard, the first conductive alloy capping layer T1 is formed over the lower metal film 136 via the same method used to form the conductive alloy capping layer 950T. The second conductive alloy capping layer T2 that includes the semiconductor element is then formed from a portion on the top surface of the lower metal film 136 contacting the first conductive alloy capping layer T1. In an exemplary embodiment, when the lower metal film 136 is formed of Cu and the semiconductor element is Si, the second conductive alloy capping layer T2 is formed of an alloy including Cu and Si, for example, CuSi or $Cu_3Si$. In an exemplary embodiment, when the lower metal film 136 is formed of Cu and the semiconductor element is Ge, the second conductive alloy capping layer T2 is formed of an alloy including Cu and Ge, such as CuGe or $Cu_3Ge$. According to an exemplary embodiment, the first and second conductive alloy capping layers T1 and T2 are annealed under a gas atmosphere that includes the semiconductor element, at a temperature from about 300° C. to 400° C., under a pressure of about 1 torr to about 20 torr, and for about 10 seconds to about 2 minutes. However, these conditions are merely exemplary, and the inventive concept is not limited thereto. The annealing process may be performed via a plasma method.

According to exemplary embodiments, to manufacture the integrated circuit device 1000B of FIG. 18, the method of manufacturing the integrated circuit device 1000A of FIG. 17 is used. The lower metal film 136 is exposed by etching the second conductive alloy capping layer T2 while forming the second hole H2 described with reference to FIG. 19E. Then, as described with reference to FIG. 19F, the upper wiring structure 160 contacting the lower metal film 136 by penetrating the capping layer 1050 is formed.

According to methods of manufacturing integrated circuit devices according to exemplary embodiments of the inventive concept, an air gap is formed in or near a corner region defined by a top surface of a lower metal film that forms a lower wiring structure and a side wall of an upper wiring structure. The air gap has a size in which a width is defined by a capping layer that covers the top surface of the lower metal film and the upper wiring structure. Accordingly, even if detachment or cracking is generated in the lower wiring structure, the upper wiring structure, insulating films surrounding the lower and upper wiring structures, or an interface therebetween, the detachment or cracking may stop spreading at the air gap. Accordingly, according to methods of manufacturing integrated circuit devices according to exemplary embodiments, an operational malfunction and lifespan deterioration of the integrated circuit devices may be suppressed by preventing detachment or cracking from spreading in a multilayered wiring structure.

Examples of structures of integrated circuit devices and methods of manufacturing the integrated circuit devices have been described with reference to FIGS. 1A through 19. However, exemplary embodiments of the inventive concept are not limited thereto, and may vary. For example, in integrated circuit devices described with reference to FIGS. 1A through 18, the top surface of the lower metal film 136 is covered by, for example, as shown in FIG. 2, a double-layered insulating capping layer that includes the first insulating capping layer 250A and the second insulating capping layer 250B, or by a capping layer that includes a similar double-layered insulating capping layer. However, exemplary embodiments are not limited thereto, and the top surface of the lower metal film 136 may be covered by a capping layer that includes at least a triple-layered insulating capping layer (also referred to as a triple-layered structure).

FIGS. 20 through 24 are cross-sectional views of integrated circuit devices 1100 through 1500, according to exemplary embodiments of the inventive concept. The integrated circuit devices 1100 through 1500 including a triple-layered insulating capping layer will be described with reference to FIGS. 20 through 24.

Figure 20:
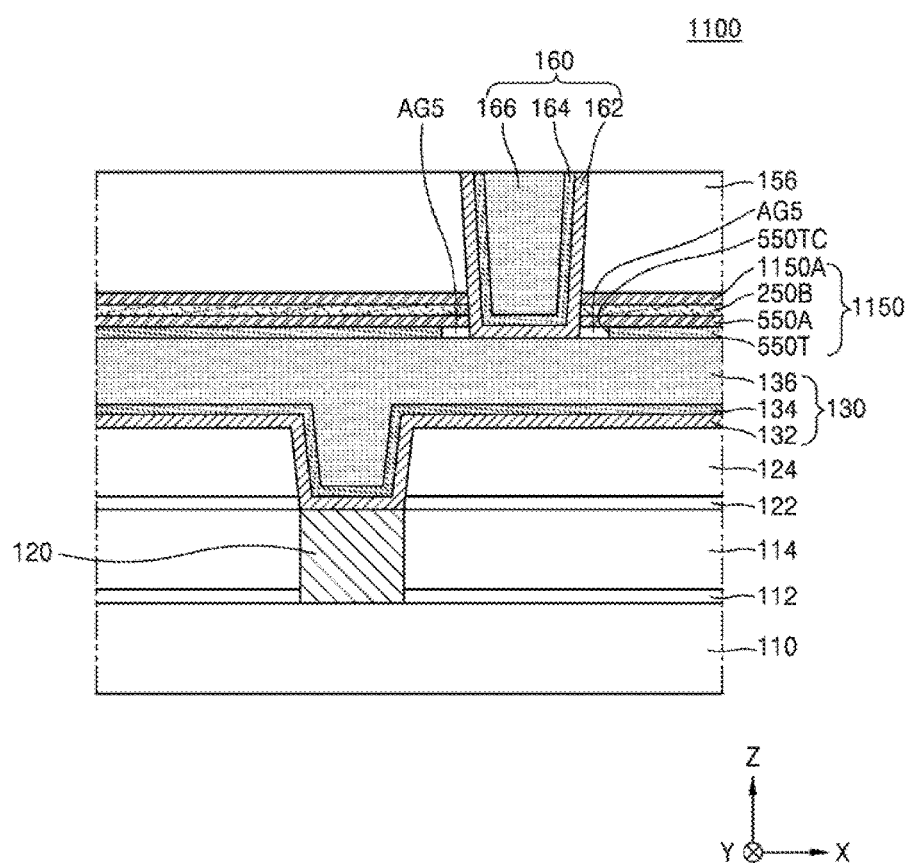
FIGS. 20 through 24 are cross-sectional views of integrated circuit devices, according to exemplary embodiments of the inventive concept.

Referring to FIG. 20, the integrated circuit device 1100 has substantially the same structure as the integrated circuit device 500 of FIG. 5. However, unlike the capping layer 550 of the integrated circuit device 500 of FIG. 5, a capping layer 1150 of the integrated circuit device 1100 of FIG. 20 further includes a third insulating capping layer 1150A that covers the second insulating capping layer 250B. For example, the capping layer 1150 includes the conductive capping layer 550T and a triple-layered insulating capping layer structure that includes the first insulating capping layer 550A, the second insulating capping layer 250B, and the third insulating capping layer 1150A, which are sequentially stacked over the conductive capping layer 550T.

In an exemplary embodiment, a side wall of the third insulating capping layer 1150A contacts the upper wiring structure 160.

Similar to the first insulating capping layer 550A, the third insulating capping layer 1150A may be formed of, for example, AlN, AlON, AlO, or AlOC. The first and third insulating capping layers 550A and 1150A may be formed of the same or different materials including, for example, AlN, AlON, AlO, or AlOC.

Figure 21:
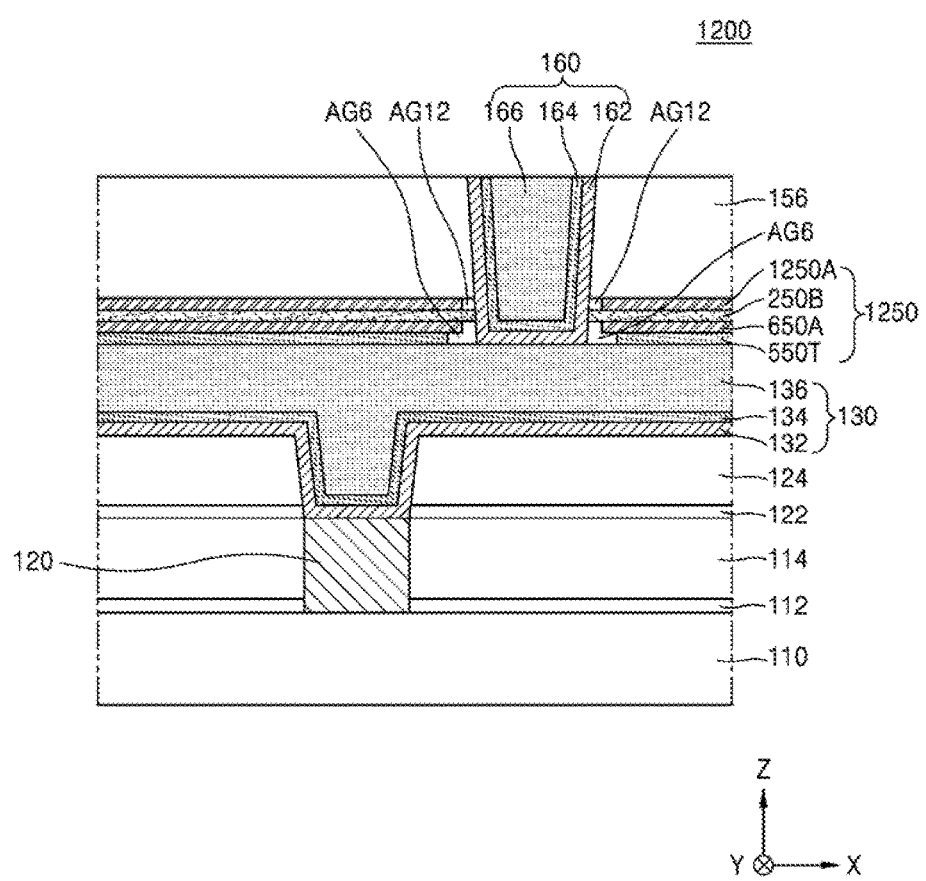

Referring to FIG. 21, the integrated circuit device 1200 has substantially the same structure as the integrated circuit device 600 of FIG. 6. However, unlike the capping layer 650 of the integrated circuit device 600 of FIG. 6, a capping layer 1250 of the integrated circuit device 1200 of FIG. 21 further includes a third insulating capping layer 1250A that covers the second insulating capping layer 250B. For example, the capping layer 1250 includes the conductive capping layer 550T and a triple-layered insulating capping layer structure that includes the first insulating capping layer 650A, the second insulating capping layer 250B, and the third insulating capping layer 1250A, which are sequentially stacked over the conductive capping layer 5501T.

In an exemplary embodiment, a side wall of the third insulating capping layer 1250A is spaced apart from the upper wiring structure 160, and an air gap AG12 is provided between the upper wiring structure 160 and the side wall of the third insulating capping layer 1250A that faces the upper wiring structure 160. The air gap AG12 is spaced apart from the air gap AG6 with the second insulating capping layer 250B interposed therebetween. Thus, in an exemplary embodiment, an air gap includes a first air gap (e.g., AG6) and a second air gap (e.g., AG12) spaced apart from each other, with the second insulating capping layer 250B disposed between the first and second air gaps: In an exemplary embodiment, a width of the air gap AG12 along an X-direction is smaller than or about equal to the upper width W6B of the air gap AG6 (see FIG. 6).

Similar to the first insulating capping layer 650A, the third insulating capping layer 1250A may be formed of, for example, AlN, AlON, AlO, or AlOC. The first and third insulating capping layers 650A and 1250A may be formed of the same or different materials including, for example, AlN, AlON, AlO, or AlOC. According to an exemplary embodiment, the first insulating capping layer 650A is formed of AlN and the third insulating capping layer 1250A is formed of any one of AlON, AlO, or AlOC. In this case, the width of the air gap AG12 along the X-direction is smaller than the upper width W6B (see FIG. 6) of the air gap AG6. According to an exemplary embodiment, when the first and third insulating capping layers 650A and 1250A are formed of the same material, the width of the air gap AG12 along the X-direction is about the same as the upper width W6B of the air gap AG6.

Figure 22:
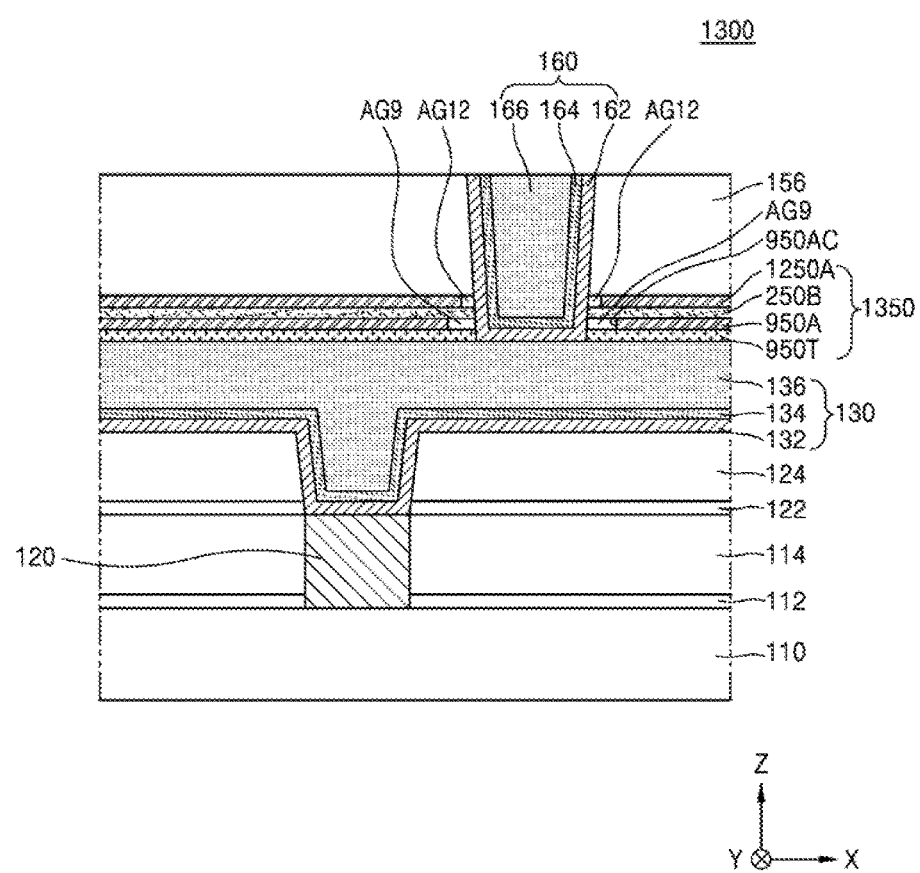

Referring to FIG. 22, the integrated circuit device 1300 has substantially the same structure as the integrated circuit device 900 of FIG. 11. However, unlike the capping layer 950 of the integrated circuit device 900 of FIG. 11, a capping layer 1350 of the integrated circuit device 1300 of FIG. 22 further includes the third insulating capping layer 1250A that covers the second insulating capping layer 250B. For example, the capping layer 1350 includes the conductive alloy capping layer 950T and a triple-layered insulating capping layer structure that includes the first insulating capping layer 950A, the second insulating capping layer 250B, and the third insulating capping layer 1250A, which are sequentially stacked over the conductive alloy capping layer 950T.

In an exemplary embodiment, the side wall of the third insulating capping layer 1250A is spaced apart from the upper wiring structure 160, and the air gap AG12 is disposed between the upper wiring structure 160 and the side wall of the third insulating capping layer 1250A that faces the upper wiring structure 160. Details regarding the third insulating capping layer 1250A are the same as or similar to those described with reference to FIG. 21.

The integrated circuit devices 1100 through 1300 that include the capping layers 1150 through 1350 and the third insulating capping layers 1150A and 1250A have been described with reference to FIGS. 20 through 22. However, exemplary embodiments are not limited thereto, and may vary. For example, each of the capping layer 150 of FIG. 1A, the capping layer 250 of FIG. 2, the capping layer 250 of FIG. 4, the capping layer 750 of FIG. 7, and the capping layer 1050 of FIG. 17 may include the third insulating capping layer 1150A, the third insulating capping layer 1250A, or a third insulating capping layer having a modified structure.

Figure 23:
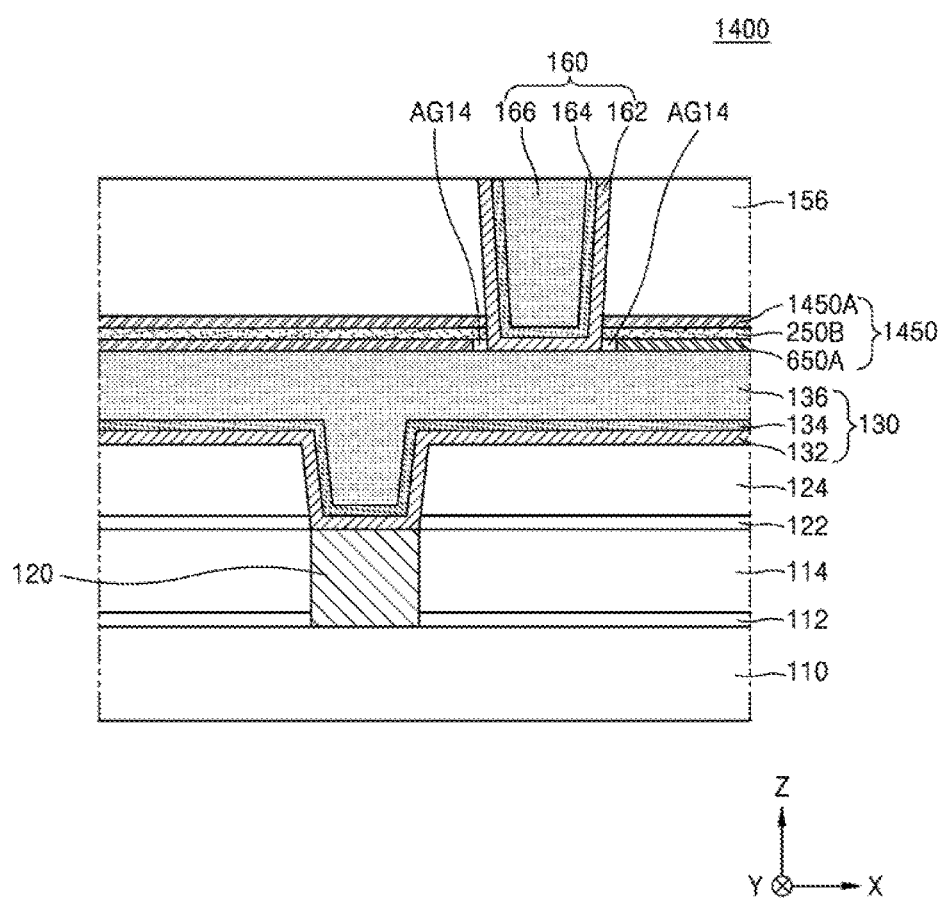

Referring to FIG. 23, the integrated circuit device 1400 has substantially the same structure as the integrated circuit device 600 of FIG. 6. However, unlike the capping layer 650 of the integrated circuit device 600 of FIG. 6, a capping layer 1450 of the integrated circuit device 1400 further includes the third insulating capping layer 1450A that covers the second insulating capping layer 250B, and does not include the conductive capping layer 550T. For example, the capping layer 1450 includes a triple-layered insulating capping layer structure that includes the first insulating capping layer 650A, the second insulating capping layer 250B, and the third insulating capping layer 1450A, which are sequentially stacked over the lower metal film 136. In an exemplary embodiment, the lower metal film 136 and the first insulating capping layer 650A contact (e.g., directly contact) each other, and the lower metal film 136 may be formed of Co.

In an exemplary embodiment, an air gap AG14 is disposed between the upper wiring structure 160 and the side wall of the first insulating capping layer 650A that faces the upper wiring structure 160, and a height of the air gap AG14 in a Z-direction is defined by the top surface of the lower metal film 136 and the bottom surface of the second insulating capping layer 250B.

In an exemplary embodiment, the side wall of the third insulating capping layer 1450A contacts (e.g., directly contacts) the upper wiring structure 160.

Details regarding the third insulating capping layer 1450A are the same as or similar to those regarding the third insulating capping layer 1150A described with reference to FIG. 20.

Figure 24:
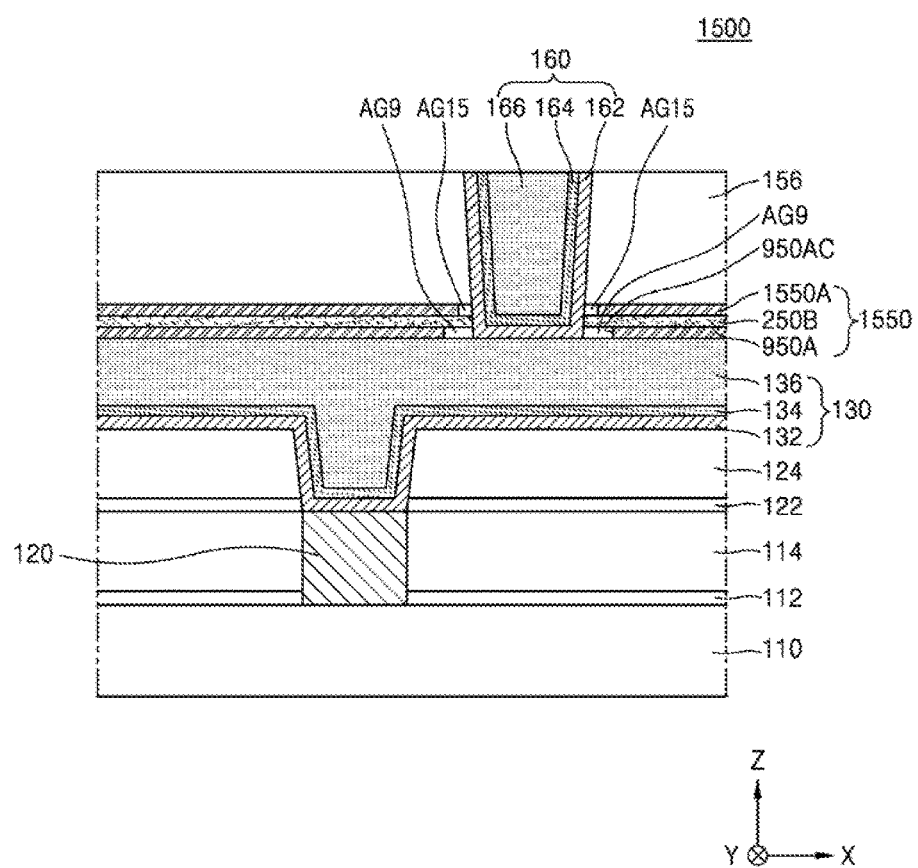

Referring to FIG. 24, the integrated circuit device 1500 has substantially the same structure as the integrated circuit device 900 of FIG. 11. However, unlike the capping layer 950 of the integrated circuit device 900 of FIG. 11, a capping layer 1550 of the integrated circuit device 1500 further includes a third insulating capping layer 1550A that covers the second insulating capping layer 250B, and does not include the conductive alloy capping layer 950T. For example, the capping layer 1550 includes a triple-layered insulating capping layer structure that includes the first insulating capping layer 950A, the second insulating capping layer 250B, and the third insulating capping layer 1550A, which are sequentially stacked over the lower metal film 136. In an exemplary embodiment, the lower metal film 136 and the first insulating capping layer 950A contact (e.g., directly contact) each other, and the lower metal film 136 may be formed of Co.

In an exemplary embodiment, the air gap AG9 is disposed between the upper wiring structure 160 and the side wall of the first insulating capping layer 950A that faces the upper wiring structure 160, and a height of the air gap AG9 in a Z-direction is defined by the top surface of the lower metal film 136 and the bottom surface of the second insulating capping layer 250B.

In an exemplary embodiment, a side wall of the third insulating capping layer 1550A is spaced apart from the upper wiring structure 160, and an air gap AG15 is disposed between the upper wiring structure 160 and the side wall of the third insulating capping layer 1550A that faces the upper wiring structure 160. In an exemplary embodiment, a height of the air gap AG15 in a Z-direction is defined by the top surface of the second insulating capping layer 250B and the bottom surface of the second insulating film 156.

Details regarding the third insulating capping layer 1550A are the same as or similar to those regarding the third insulating capping layer 1150A described with reference to FIG. 20.

The integrated circuit devices 1400 and 1500 that include the capping layers 1450 and 1550, which include a triple-layered insulating capping layer and do not include a conductive capping layer, have been described with reference to FIGS. 23 and 24. However, exemplary embodiments are not limited thereto, and may vary. For example, in exemplary embodiments, each of the capping layer 150 of FIG. 1A, the capping layer 250 of FIG. 2, the capping layer 250 of FIG. 4, the capping layer 550 of FIG. 5, the capping layer 750 of FIG. 7, and the capping layer 1050 of FIG. 17 may include the third insulating capping layer 1450A, the third insulating capping layer 1550A, or a third insulating capping layer having a modified structure.

The integrated circuit devices 1100 through 1500 described with reference to FIGS. 20 through 24 respectively include the air gaps AG5, AG9, AG12, AG14, and AG15 formed in or near a corner region defined by the top surface of the lower metal film 136 that forms the lower wiring structure 130 and the side wall of the upper wiring structure 160. Accordingly, even if detachment or cracking is generated in the lower wiring structure 130, the upper wiring structure 160, insulating films surrounding the lower and upper wiring structures 130 and 160, or an interface therebetween, when the detachment or cracking reaches the air gap AG5, AG9, AG12, AG14, or AG15, the detachment or cracking may stop spreading at the air gap AG5, AG9, AG12, AG14, or AG15. Accordingly, in integrated circuit devices 1100 through 1500 according to exemplary embodiments, even when detachment or cracking is generated in a multilayered wiring structure, the detachment or cracking is blocked from spreading, thereby preventing an operational malfunction or lifespan deterioration of the integrated circuit devices 1100 through 1500, thus increasing reliability of the integrated circuit devices 1100 through 1500.

The integrated circuit devices 1100 through 1500 of FIGS. 20 through 24 may be manufactured using the method of manufacturing the integrated circuit device 500 described with reference to FIGS. 19A through 19F.

Figure 25A:
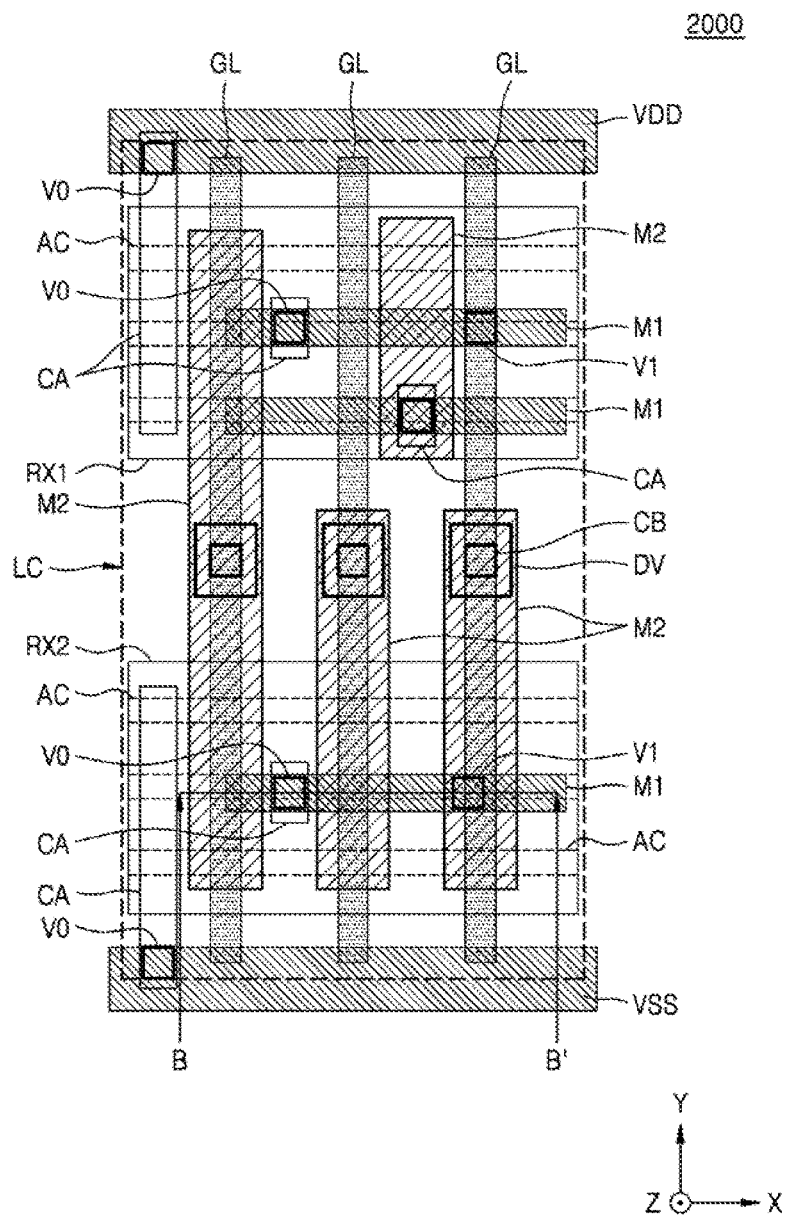
FIG. 25A is a layout diagram of components of an integrated circuit device, according to an exemplary embodiment of the inventive concept.
Figure 25B:
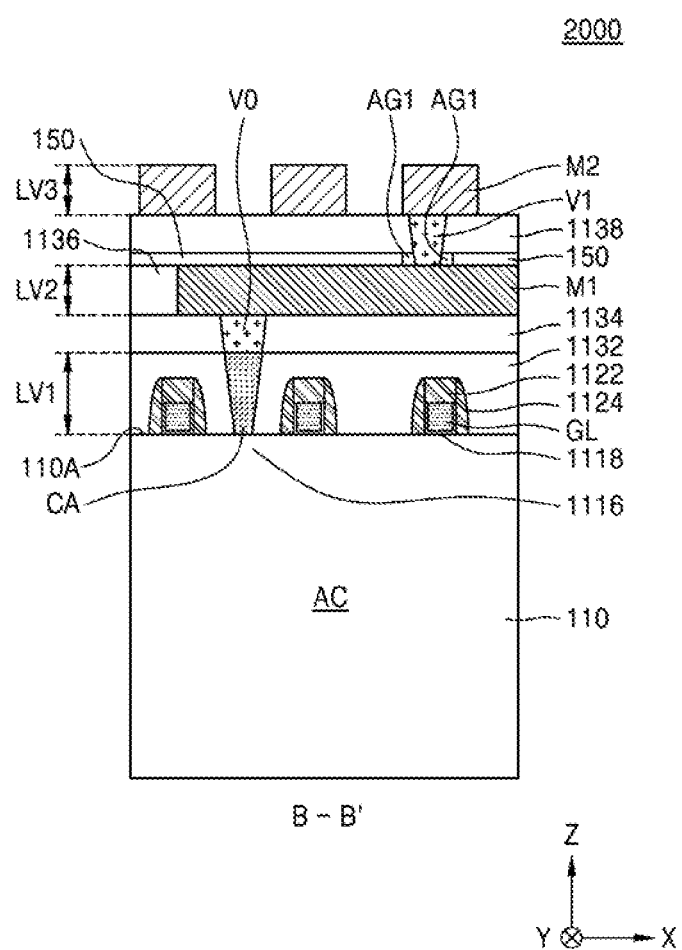
FIG. 25B is a cross-sectional view taken along line B-B' of FIG. 25A, according to an exemplary embodiment of the inventive concept.

FIGS. 25A and 25B are diagrams illustrating an integrated circuit device 2000, according to an exemplary embodiment of the inventive concept. FIG. 25A is a layout diagram of components of the integrated circuit device 2000, according to an exemplary embodiment of the inventive concept. FIG. 25B is a cross-sectional view taken along line B-B' of FIG. 25A, according to an exemplary embodiment of the inventive concept. The integrated circuit device 2000 of FIGS. 25A and 25B may form a logic cell including a fin-field effect transistor (FinFET) device.

Referring to FIGS. 25A and 25B, a logic cell region LC of the substrate 110 includes a first device region RX1 and a second device region RX2. The first and second device regions RX1 and RX2 include a plurality of fin-type active regions AC that protrude from the substrate 110. The plurality of fin-type active regions AC may extend substantially parallel to each other along one direction (X-direction). In an exemplary embodiment, a device isolation film is formed between the plurality of fin-type active regions AC over the substrate 110, and the plurality of fin-type active regions AC protrude above the device isolation film, in the shape of a fin. A plurality of gate insulating films 1118 and a plurality of gate lines GL extend in a direction (Y-direction) over the substrate 110, crossing the plurality of fin-type active regions AC. The plurality of gate insulating films 1118 and the plurality of gate lines GL extend while covering a top surface and two side walls of each of the plurality of fin-type active regions AC, and a top surface of the device isolation film. A plurality of metal-oxide semiconductor (MOS) transistors are formed along the plurality of gate lines GL. The plurality of MOS transistors may each be, for example, a 3-dimensional (3D) MOS transistor forming a channel on the top surface and the two side walls of each of the fin-type active regions AC.

The plurality of gate insulating films 1118 may each be, for example, a silicon oxide film, a high dielectric film, or a combination thereof. The high dielectric film may be formed of, for example, a metal oxide having a higher dielectric constant than the silicon oxide film. The plurality of gate lines GL may each include a work function metal-containing layer and a gap-fill metal film. The work function metal-containing layer may include at least one metal including, for example, Ti, W, Ru, Nb, Mo, Hf, Ni, Co, Pt, Yb, Tb, Dy, Er, or Pd. The gap-fill metal film may be a W film or an Al film. According to an exemplary embodiment, the plurality of gate lines GL may each have a stacked structure of, for example, TiAlC/TiN/W, TiN/TaN/TiAlC/TiN/W, or TiN/TaN/TiN/TiAlCfTiN/W. Each of the plurality of gate lines GL has a top surface covered by an insulating capping pattern 1122 and sidewalls covered by an insulating spacer 1124. Each of the insulating capping pattern 1122 and the insulating spacer 1124 may be formed of a silicon nitride layer.

A plurality of first contacts CA connected to a source/drain region 1116 of the plurality of fin-type active regions AC, and a plurality of second contacts CB connected to the plurality of gate lines GL, are formed at a first level LV1 over the plurality of fin-type active regions AC. The pluralities of first and second contacts CA and CB are insulated from each other by a first interlayer insulating film 1132 that covers the pluralities of fin-type active regions AC and gate lines GL.

A second interlayer insulating film 1134 and a plurality of lower via contacts V0 penetrating the second interlayer insulating film 1134 are formed over the first interlayer insulating film 1132.

A plurality of first wiring layers M1 that extend in a horizontal direction at a second level LV2 higher than the first level LV1 are formed over the second interlayer insulating film 1134. The plurality of first wiring layers M1 extend over the second interlayer insulating film 1134, substantially in parallel to an extending direction of a main surface 110A of the substrate 110. Each of the plurality of first wiring layers M1 is connected to one of the pluralities of first and second contacts CA and CB through one of the plurality of lower via contacts V0 disposed between the first and second levels LV1 and LV2. Each of the plurality of lower via contacts V0 is connected to one of the pluralities of first and second contacts CA and CB by penetrating the second interlayer insulating film 1134. The lower via contacts V0 are insulated from one another by the second interlayer insulating film 1134.

In the logic cell region LC, a power supply line VDD is connected to the fin-type active region AC in the first device region RX1, and a ground line VSS is connected to the fin-type active region AC in the second device region RX2. The power supply line VDD and the ground line VSS are respectively connected to the fin-type active region AC of the first device region RX1 and the fin-type active region AC of the second device region RX2 through one of the plurality of lower via contacts V0. The plurality of first wiring layers M1, the power supply line VDD, and the ground line VSS are insulated from one another by a third interlayer insulating film 1136.

The plurality of lower via contacts V0, the plurality of first wiring layers M1, the power supply line VDD, and the ground line VSS may each have a stacked structure of a conductive barrier film and a metal film. The conductive barrier film and the metal film may have the same structure as the lower conductive barrier film 132 and the lower metal film 136 of the lower wiring structure 130 described with reference to FIG. 1A.

A fourth interlayer insulating film 1138 that covers the third interlayer insulating film 1136 and the plurality of first wiring layers M1 may be formed. According to an exemplary embodiment, the first through fourth interlayer insulating films 1132, 1134, 1136, and 1138 may be formed of the same material, or at least some of the first through fourth interlayer insulating films 1132, 1134, 1136, and 1138 may be formed of different materials. Details regarding the first through fourth interlayer insulating films 1132, 1134, 1136, and 1138 are same as or similar to those regarding the lower insulating film 114 described with reference to FIG. 1A.

A plurality of upper via contacts V that penetrate the fourth interlayer insulating film 1138 is formed over the plurality of first wiring layers M1. A plurality of second wiring layers M2 that extend in a direction crossing the plurality of first wiring layers M1 is formed over the upper via contact V1, at a third level LV3 higher than the second level LV2. Each of the plurality of second wiring layers M2 is connected to one of the plurality of first wiring layers M1 through one of the plurality of upper via contacts V1 disposed between the second and third levels LV2 and LV3. Some of the plurality of second wiring layers M2 are connected to one of the plurality of gate lines GL through one of a plurality of via contacts DV. The plurality of upper via contacts V1 extend down to one of the plurality of first wiring layers M1 by penetrating the fourth interlayer insulating film 1138. Each of the pluralities of upper via contacts V1 and second wiring layers M2 may have a stacked structure of a conductive barrier film and a metal film. The conductive barrier film and the metal film may have the same structure as the upper conductive barrier film 162 and the upper metal film 166 of the upper wiring structure 160 described with reference to FIG. 1A.

The capping layer 150 extending to cover a top surface of the first wiring layer M1 and a top surface of the third interlayer insulating film 1136 is provided between the first wiring layer M1 and the fourth interlayer insulating film 1138. The air gap AG1 is disposed between the first wiring layer M1 and the fourth interlayer insulating film 1138. The air gap AG1 is disposed in a corner region defined by the top surface of the first wiring layer M1 and the side wall of the upper via contact V1. The width of the air gap AG1 may be defined by the capping layer 150 and the upper via contact V1. Details regarding the capping layer 150 and air gap AG1 have been described with reference to FIG. 1A. In FIG. 25B, the air gap AG1 is formed over the first wiring layer M connected to the first contact CA, however, the inventive concept is not limited thereto. For example, the air gap AG1 may also be formed over the first wiring layer M1 connected to the second contact CB in the manner shown in FIG. 25B.

In the integrated circuit device 2000 of FIGS. 25A and 25B, the air gap AG1 is formed in the corner region defined by the top surface of the first wiring layer M1 that forms the lower wiring structure and the side wall of the upper via contact V1 that forms the upper wiring structure. Accordingly, even if detachment or cracking is generated in the plurality of first wiring layers M1, the plurality of upper via contacts V1, the plurality of second wiring layers M2, insulating films surrounding the lower and upper wiring structures, or an interface therebetween, the detachment or cracking may stop spreading at the air gap AG1. Accordingly, an operational malfunction and lifespan deterioration of the integrated circuit device 2000 may be suppressed, and thus, reliability of the integrated circuit device 2000 may increase by preventing detachment or cracking from spreading in a multilayered wiring structure.

The integrated circuit device 2000 of FIGS. 25A and 25B includes the capping layer 150 and the air gap AG1 of FIG. 1A, but is not limited thereto. For example, the integrated circuit device 2000 of FIGS. 25A and 25B may include any one of capping layers and air gaps described with reference to FIGS. 1A through 18 and FIGS. 20 through 24.

While the inventive concept has been particularly shown and described with reference to the exemplary embodiments thereof, it will be understood by those of ordinary skill in the art that various changes in form and detail may be made therein without departing from the spirit and scope of the inventive concept as defined by the following claims.

What is claimed is:
1. An integrated circuit device, comprising:
a lower wiring structure comprising a lower metal film, wherein the lower wiring structure penetrates at least a portion of a first insulating film disposed over a substrate;
a capping layer covering a top surface of the lower metal film;

a second insulating film covering the capping layer;
an upper wiring structure penetrating the second insulating flint and the capping layer, and electrically connected to the lower metal film; and
an air gap disposed between the lower metal film and the second insulating film, and having a width defined by a distance between the capping layer and the upper wiring structure,
wherein the air gap is disposed between the upper wiring structure and the capping layer such that the upper wiring structure does not contact the capping layer.

2. The integrated circuit device of claim 1, wherein the air gap is disposed at a corner region defined by the top surface of the lower metal film and a side wall of the upper wiring structure.

3. The integrated circuit device of claim 1, wherein the air gap surrounds at least a portion of the upper wiring structure at a location perpendicularly overlapping the lower metal film.

4. The integrated circuit device of claim 1,
wherein the capping layer comprises a conductive capping layer, a first insulating capping layer comprising a metal, and a second insulating capping layer that does not comprise the metal or another metal,
wherein the conductive capping layer, the first insulating capping layer, and the second insulating capping layer are sequentially stacked on one another,
wherein the air gap is disposed between the conductive capping layer and the upper wiring structure.

5. The integrated circuit device of claim 4,
wherein a side wall of the conductive capping layer that faces the upper wiring structure, and a side wall of the first insulating capping layer that faces the upper wiring structure, are each spaced apart from the upper wiring structure,
wherein the air gap is disposed between the side wall of the conductive capping layer and the upper wiring structure, and between the side wall of the first insulating capping layer and the upper wiring structure.

6. The integrated circuit device of claim 4, wherein the air gap has a first width along a first direction between the conductive capping layer and the upper wiring structure, and has a second width, different from the first width, along the first direction between the first insulating capping layer and the upper wiring structure.

7. The integrated circuit device of claim 4, wherein the air gap is disposed between the lower metal film and the second insulating capping layer.

8. The integrated circuit device of claim 1,
wherein the capping layer comprises a first conductive alloy capping layer comprising a first metal and a semiconductor element, a first insulating capping layer comprising a second metal different from the first metal, and a second insulating capping layer that does not comprise the first metal, the second metal, or another metal,
wherein the first conductive alloy capping layer, the first insulating capping layer, and the second insulating capping layer are sequentially stacked on one another,
wherein the air gap is disposed between the first conductive alloy capping layer and the second insulating capping layer.

9. The integrated circuit device of claim 8,
wherein the capping layer further comprises a second conductive alloy capping layer disposed between the lower metal film and the first conductive alloy capping layer,
wherein the second conductive alloy capping layer comprises the semiconductor element and a third metal different from the first metal.

10. The integrated circuit device of claim 1,
wherein the capping layer comprises a conductive capping layer and an insulating capping layer covering the conductive capping layer and having a triple-layered structure,
wherein the insulating capping layer comprises a first insulating capping layer comprising a metal, a second insulating capping layer that does not comprise the metal or another metal, and a third insulating capping layer comprising the metal or another metal,
wherein the first insulating capping layer, the second insulating capping layer, and the third insulating capping layer are sequentially stacked on one another.

11. The integrated circuit device of claim 10, wherein the air gap is disposed between the conductive capping layer and the upper wiring structure.

12. The integrated circuit device of claim 10, wherein the air gap is disposed between the upper wiring structure and at least one of the first and third insulating capping layers.

13. The integrated circuit device of claim 1,
wherein the capping layer comprises an insulating capping layer contacting a top surface of the lower metal film and having a triple-layered structure,
wherein the insulating capping layer comprises a first insulating capping layer comprising a metal, a second insulating capping layer that does not comprise the metal or another metal, and a third insulating capping layer comprising the metal or another metal,
wherein the first insulating capping layer, the second insulating capping layer, and the third insulating capping layer are sequentially stacked on one another.

14. The integrated circuit device of claim 1,
wherein the upper wiring structure comprises an upper metal film and a conductive barrier film surrounding the upper metal film,
wherein the conductive barrier film comprises a first portion facing the second insulating film and having a first thickness, and a second portion facing the air gap and having a second thickness smaller than the first thickness.

15. An integrated circuit device, comprising:
a lower wiring structure comprising a lower metal film that extends in a first direction, and that penetrates at least a portion of a first insulating film disposed over a substrate;
a capping layer covering a top surface of the lower metal film and a top surface of the first insulating film;
a second insulating film covering the capping layer;
a contact plug penetrating the second insulating film and the capping layer, and electrically connected to the lower metal film; and
an air gap disposed between the lower metal film and the second insulating film, wherein the air gap is disposed at a corner region defined by the top surface of the lower metal film and a side wall of the contact plug,
wherein the air gap surrounds the con act plug in a plan view.

16. The integrated circuit device of claim 15,
wherein the capping layer comprises a conductive capping layer covering the lower metal film, a first insulating capping layer comprising a metal and covering the lower metal film and the first insulating film, and a second insulating capping layer that does not comprise the metal or another metal and that covers the first insulating capping layer, wherein a width of the air gap in the first direction is about equal to a horizontal distance between the contact plug and at least one of the conductive capping layer or the first insulating capping layer.

17. The integrated circuit device of claim 15, wherein the capping layer comprises a conductive capping layer covering the lower metal film, and an insulating capping layer having a triple-layered structure covering the conductive capping layer, wherein the insulating capping layer comprises a first insulating capping layer comprising a metal, a second insulating capping layer that does not comprise the metal or another metal, and a third insulating capping layer comprising the metal or another metal, wherein the first insulating capping layer, the second insulating capping layer, and the third insulating capping layer are sequentially stacked on one another.

18. The integrated circuit device of claim 17, wherein the air gap comprises a first air gap and a second air gap spaced apart from each other, wherein the second insulating capping layer is disposed between the first air gap and the second air gap.

19. The integrated circuit device of claim 15, wherein the capping layer comprises an insulating capping layer having a triple-layered structure contacting the top surface of the lower metal film, wherein the insulating capping layer comprises a first insulating capping layer comprising a metal, a second insulating capping layer that does not comprise the metal or another metal, and a third insulating capping layer comprising the metal or another metal, wherein the first insulating capping layer, the second insulating capping layer, and the third insulating capping layer are stacked on one another, wherein the air gap is disposed between the contact plug and at least one of the first and third insulating capping layers.

20. An integrated circuit device, comprising:

a lower wiring structure comprising a lower metal film that extends in a first direction, and that penetrates at least a portion of a first insulating film disposed over a substrate;

a capping layer covering a top surface of lower metal film and a top surface of the first insulating film;

a second insulating film covering the capping layer;

a contact plug penetrating the second insulating film and the capping layer, and electrically connected in the lower metal film; and an air gap disposed between the lower mental film and the second insulating film, wherein the air gap is disposed at a corner region defined by the top surface of the lower metal film and a side wall of the contact plug, wherein the contact plug comprises a first portion perpendicularly overlapping the lower wiring structure and a second portion perpendicularly overlapping the first insulating film, wherein the air gap surrounds the contact plug in the first portion and does not surround the contact ping in the second portion.

* * * * *